(12) United States Patent
Ishida et al.

(10) Patent No.: US 6,562,644 B2
(45) Date of Patent: May 13, 2003

(54) SEMICONDUCTOR SUBSTRATE, METHOD OF MANUFACTURING THE SEMICONDUCTOR SUBSTRATE, SEMICONDUCTOR DEVICE AND PATTERN FORMING METHOD

(75) Inventors: Masahiro Ishida, Hirakata (JP); Masahiro Ogawa, Higashiosaka (JP); Masaya Mannoh, Nara (JP); Masaaki Yuri, Ibaraki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/921,885

(22) Filed: Aug. 6, 2001

(65) Prior Publication Data

US 2002/0037599 A1 Mar. 28, 2002

(30) Foreign Application Priority Data

Aug. 8, 2000 (JP) ........................ 2000-239705

(51) Int. Cl.[7] .............................................. H01L 21/00
(52) U.S. Cl. ........................... 438/29; 438/46; 438/604; 438/758
(58) Field of Search ....................... 117/90, 97; 438/29, 438/46, 47, 602, 604, 606, 607, 758

(56) References Cited

U.S. PATENT DOCUMENTS

| 5,679,152 A | 10/1997 | Tischler et al. |
| 5,810,925 A | 9/1998 | Tadatomo et al. |
| 6,233,264 B1 * | 5/2001 | Sato ............................. 372/45 |
| 6,417,901 B1 * | 7/2002 | Okada et al. ................ 349/113 |

FOREIGN PATENT DOCUMENTS

| JP | 2000-12900 | 1/2000 |
| JP | 2000-22212 | 1/2000 |

OTHER PUBLICATIONS

Jaeger, "Introduction to Microelectronic fabrication", vol. 5, Addision Wesley Longman, Chapter 2, Lithography, pp. 13–26 (1993).*

* cited by examiner

*Primary Examiner*—Kamand Cuneo
*Assistant Examiner*—Asok Kumar Sarkar
(74) *Attorney, Agent, or Firm*—Nixon Peabody LLP; Donald R. Studebaker

(57) ABSTRACT

A semiconductor substrate comprises a semiconductor layer comprising a group III nitride as a main component. A scattering portion for scattering an incident beam of light incident on one plane of the semiconductor layer is provided on another plane or inside of the semiconductor layer.

4 Claims, 20 Drawing Sheets

SEMICONDUCTOR SUBSTRATE, METHOD OF MANUFACTURING THE SEMICONDUCTOR SUBSTRATE, SEMICONDUCTOR DEVICE AND PATTERN FORMING METHOD

BACKGROUND OF THE INVENTION

The present invention relates to a nitride semiconductor substrate to be used as a substrate for a blue light-emitting diode or a blue semiconductor laser device or the like, a method of manufacturing the semiconductor substrate, a semiconductor device employing the nitride semiconductor substrate, and a pattern forming method for the manufacture of the semiconductor device.

Conventionally, semiconductor devices such as a blue light-emitting diode (blue LED) or a blue semiconductor laser device employing a group III nitride such as GaN (gallium nitride), InN (indium nitride), AlN (aluminum nitride), or their mixed crystals, have been in most cases formed on a sapphire substrate.

In the manufacturing process of the semiconductor devices employing the nitride semiconductor, particularly in the manufacturing process of semiconductor laser devices, registration errors on the order of 1 μm do not pose any practical problems. Accordingly, a sufficient registration accuracy can be ensured by using inexpensive exposure apparatus (costing about ten thousand yen per unit) using g-line (wavelength 436 nm) or i-line (wavelength 365 nm) of a mercury lamp, instead of the expensive KrF steppers (costing several billion yen per unit), which are used in the photolithography process for Si (silicon).

However, there was a problem that with an increasing use of a nitride semiconductor substrate as a substrate for the semiconductor device, the accuracy of the resist pattern (hereinafter referred to as a pattern accuracy) drops in the photolithography step during the formation of the semiconductor device, particularly when the pattern is formed by the exposure apparatus using the g- or i-line of the mercury lamp, thereby significantly lowering the yield of the semiconductor device.

SUMMARY OF THE INVENTION

Accordingly, it is an object of the invention to improve the pattern accuracy in the photolithography step during the manufacture of the semiconductor device using the nitride semiconductor substrate.

To achieve this object, the present inventors analyzed the cause of deterioration in the pattern accuracy during the pattern formation by the g- or i-line when the conventional nitride semiconductor substrate is used. The analysis revealed the following facts.

FIG. 23 illustrates the exposure of the resist film formed on a conventional nitride semiconductor substrate, specifically a substrate made from GaN (hereinafter referred to as a GaN substrate).

As shown in FIG. 23, a resist film 2 on a GaN substrate 1 is irradiated with an exposure light beam 4 such as the i-line through a photomask 3 with an opening 3a. The wavelength of light that can be absorbed by the nitride semiconductor is short, such as no more than 360 nm in the case of GaN. Accordingly, when the g- or i-line is used as the exposure light beam 4, the exposure light beam 4 that is incident on the surface of the GaN substrate 1 through the resist film 2, i.e., an incident light beam 4, propagates through the GaN substrate 1 without being absorbed. As a result, the incident light beam 4 splits into an emitted light 5 emitted from the back surface of the GaN substrate 1 and a reflected light 6 due to the reflection by the back surface of the GaN substrate 1. When the back surface of the GaN substrate 1 is specular, its reflectance with respect to the incident light beam 4, i.e., the reflectance of the interface between the GaN substrate 1 and air with respect to the incident light beam 4, is as much as about 20%.

A region 2a of the resist film 2 is the region to be exposed by the incident light beam 4. However, as the resist film 2a is exposed from below by the reflected light beam 6, a region 2b of the resist film 2 which is not to be exposed is also exposed. This results in defects such as a peeling of the resist film 2 or a reduction in the resist pattern size, thereby preventing a correct pattern formation in the case of using the conventional nitride semiconductor substrate.

It was also found that the problem of deterioration in the pattern accuracy is pronounced when the intensity of the reflected light beam 6 is increased by a reduction in the thickness of the GaN substrate 1 which makes it easier for the incident light beam 4 to pass through the GaN substrate 1, or when the opening width of the opening 3a of the photomask 3 is not more than several times the wavelength of the incident light beam 4 or exposure light beam, in which case the incident light beam 4, after passing through the opening 3a, is diffracted towards the outside of the opening 3a, with the reflected light beam 6 being extended further outside (see FIG. 23).

It should be noted that in the present specification, the term "reflection" means specular reflection (angle of incidence=angle of reflection), and the term "reflectance" means specular reflectance. Reflections other than the specular reflection are referred to as "diffuse reflections". The term "substrate surface" refers to the surface on which a nitride semiconductor layer is grown during the manufacture of the semiconductor device using the nitride semiconductor substrate.

Based on the above-mentioned findings, the present invention provides a first semiconductor substrate comprising a semiconductor layer having a group III nitride as a main component, wherein a scattering portion for scattering an incident beam of light entering the semiconductor layer through one plane thereof is provided on another plane or inside of the semiconductor layer.

In the first semiconductor substrate of the invention, the scattering portion for scattering the incident beam of light entering the semiconductor layer from one plane thereof is provided at another plane or inside the semiconductor layer, the semiconductor layer forming the substrate and having a group III nitride as the main component. Accordingly, the intensity of the reflected beam of light created by the reflection of the incident light beam by the another plane can be reduced. This prevents the problem of exposing a region of the resist film that is not to be exposed by the exposure light beam entering through the one plane (hereinafter sometimes referred to as a substrate surface) and reflected by the another surface (hereinafter sometimes referred to as a substrate back surface), in a photolithography step for the manufacture of a semiconductor device using the first semiconductor substrate, i.e., a nitride semiconductor substrate. Thus the pattern accuracy in the photolithography step can be increased and therefore the manufacturing yield of the nitride semiconductor device can be improved. For example, if the first semiconductor substrate is a GaN substrate, particularly the reflection of the g- or i-line of the mercury lamp can be surely prevented, so that the pattern accuracy in the photolithography step using the g- or i-line as the exposure light beam can be significantly improved, with a resultant significant improvement in the manufacturing yield of the nitride semiconductor device.

In the first semiconductor substrate of the invention, the scattering portion preferably may comprise height irregularity formed on the another plane of the semiconductor layer, the height irregularity having a height difference of $\frac{1}{10}$ or more of the wavelength of the incident beam of light.

This makes the incident beam of light efficiently diffused, i.e., scattered, on the another plane, thereby reducing the reflectance of the another plane against the incident beam of light and thus surely reducing the intensity of the reflected light.

In another embodiment of the invention, the reflectance of the another plane of the semiconductor layer against the incident beam of light is preferably 13% or less, and the wavelength of the incident beam of light is preferably 365 nm (i-line) or 436 nm (g-line).

In yet another embodiment of the invention, the scattering portion is preferably provided inside the semiconductor layer and includes particles or layer of a material having a different index of refraction than that of the group III nitride with respect to the incident beam of light.

In this embodiment, since the incident beam of light can be efficiently scattered inside the semiconductor layer, the intensity of the reflected beam of light can surely be reduced.

The diameter of each particle of the material, the width of the layer of the material in a direction parallel to the one plane, or the thickness of the layer of the material, are in each case about $\frac{1}{10}$ or more of the wave length of the incident beam of light. It is also preferable that the particles or layer of the material are provided in a direction parallel to the one plane of the semiconductor layer, that the scattering portion is provided in a direction parallel to the one plane of the semiconductor layer, and that the scattering portion includes another semiconductor layer having the group III nitride as a main component and the particles or layer stacked alternately. The scattering portion preferably has a thickness of about $\frac{1}{10}$ or more of the wave of the incident beam of light. The above-mentioned material is preferably Si, $SiO_2$, SiN or $Al_2O_3$. The scattering portion preferably has a transmittance of 80% or less with respect to the incident beam of light, and the wave of the incident beam of light is preferably 365 nm or 436 nm.

A second semiconductor substrate according to the present invention comprises a semiconductor layer having a group III nitride as a main component, wherein a transmitting portion for transmitting an incident beam of light entering the semiconductor layer from one plane thereof is provided on another plane of the semiconductor layer.

In accordance with the second semiconductor substrate, the transmitting portion for transmitting the incident beam of light entering the semiconductor layer forming the substrate from the one plane thereof is provided on the another plane of the semiconductor layer, the semiconductor layer having a group III nitride as a main component. Accordingly, the reflectance of the another plane with respect to the incident beam of light can be reduced, whereby the intensity of the reflected light caused by the reflection of the incident beam of light by the another plane. Thus, the problem of exposing a region of the resist film that is not to be exposed by the exposing beam of light entering from the one plane (substrate surface) and reflected by the another plane (substrate back surface) can be prevented in the photolithography step in the manufacture of a semiconductor device using the second semiconductor substrate or nitride semiconductor substrate. The pattern accuracy in the photolithography step can therefore be improved and thus the manufacturing yield of the nitride semiconductor device can be increased. For example, when the second semiconductor substrate is a GaN substrate, particularly the reflection of the g- or i-line of the mercury lamp by the substrate back surface can be surely prevented. As a result, the pattern accuracy in the photolithography step using the g- or i-line as the exposing beam of light can be significantly improved, resulting in a significantly improved manufacturing yield of the nitride semiconductor device.

In the second semiconductor substrate, the transmitting portion preferably comprises a layer formed on the another plane of the semiconductor layer, the layer formed from a material with a different index of refraction than that of the group III nitride with respect to the incident beam of light.

In this manner, the reflectance of the another plane with respect to the incident beam of light can be surely reduced.

In this case, the layer of the above-mentioned material preferably is composed of a plurality of layers, of which at least two have different indexes of refraction with respect to the incident beam of light. The material preferably has an index of refraction which is about $\frac{9}{10}$ or less of that of the group III nitride with respect to the incident beam of light. The material is preferably $SiO_2$, SiN or $Al_2O_3$, a compound of the group III element forming the semiconductor layer and oxygen, or $Al_xGa_{1-x}N$ ($0<x\leq1$). In the case where the material is a compound of the group III element forming the semiconductor layer and oxygen, the manufacturing process can be simplified as compared with the case of forming a transmitting portion newly on the substrate back surface in the form of a film. Further, the potential mixture of an impurity into the substrate can be prevented, thereby improving the manufacturing yield of the substrate.

In the second semiconductor substrate, the transmitting portion preferably has a transmittance of 80% or more with respect to the incident beam of light.

By doing so, the reflectance of the another plane against the incident light can be surely reduced. Further, it is also preferable that the wavelength of the incident light is 365 nm or 436 nm.

In the second semiconductor substrate, it is further preferable that a scattering portion is provided either between the another plane of the semiconductor layer and the transmitting portion or inside the semiconductor layer for scattering the incident light.

By so doing, the incident light is first scattered by the scattering portion and then transmitted by the transmitting portion, so that the intensity of the reflected light can be further reduced.

A third semiconductor substrate according to the invention comprises a semiconductor layer having a group III nitride as a main component, wherein an absorbing portion for absorbing the incident beam of light entering the semiconductor layer from one plane thereof is provided at least a part of the semiconductor layer.

In the third semiconductor substrate, the absorbing portion for absorbing the incident beam of light entering from the one plane of the semiconductor layer, which forms the substrate and has the group III nitride as a main component, is provided at least a part of the semiconductor layer. Accordingly, the intensity of the reflected beam of light caused by the reflection of the incident beam of light on the another plane can be reduced. Thus, in the photolithography step for the manufacture of a semiconductor device using the third semiconductor substrate or nitride semiconductor substrate, the problem of exposing a region of the resist film that is not to be exposed by the exposing beam of light entering from the one plane (substrate surface) and reflected by the another plane (substrate back surface) can be avoided. As a result, the pattern accuracy in the photolithography step can be improved, and therefore the manufacturing yield of the nitride semiconductor device can be improved. For example, when the third semiconductor substrate is a GaN substrate, particularly the reflection o the g- or i-line of the mercury lamp by the substrate back surface can be surely prevented, so that the pattern accuracy in the photolithography step using the g- or i-line as the exposing beam of light can be significantly increased, thereby also improving the manufacturing yield of the nitride semiconductor device.

In the third semiconductor substrate, it is preferable that the transmittance of the absorbing portion against the incident beam of light is 80% or less.

By so doing, even when the substrate back surface is specular, the reflectance of the substrate back surface against the incident beam of light can be reduced to substantially 13% or lower, thereby surely improving the pattern accuracy in the photolithography step. Also, the wavelength of the incident beam of light is preferably 365 nm or 436 nm.

In the third semiconductor substrate, the absorbing portion is preferable made from a material with a larger absorption coefficient than that of the group III nitride with respect to the incident beam of light.

By so doing, the incident beam of light can be surely absorbed by the absorbing portion, whereby the intensity of the incident beam of light can be surely reduced. In this case, it is preferable that the material is composed of a plurality of materials having different absorption coefficients with respect to the incident beam of light, or includes at least one of Si and W.

In the third semiconductor substrate, the absorption portion is formed by adding an impurity to the semiconductor layer such that a level arises that absorbs the incident beam of light.

By so doing, the incident beam of light can be surely absorbed by the absorbing portion, so that the intensity of the reflected beam of light can be surely reduced, and the lowering of crystallinity of the third semiconductor substrate or nitride semiconductor substrate can be prevented. Further, the impurity preferably contains at least one of C, O, Si, S, Cl, P and As. It is also preferable that the relationship $z0$ $0.223/\alpha$ holds where $\alpha$ is the absorption coefficient of the absorbing portion with respect to the incident beam of light and $z0$ is the thickness of the absorbing portion.

In the third semiconductor substrate, the absorbing portion preferably comprises point defects formed in the semiconductor layer.

By so doing, the incident beam of light can be surely absorbed by the absorbing portion, so that the intensity of the reflected beam of light can be surely reduced, and also the lowering of crystallinity of the third semiconductor substrate or nitride semiconductor substrate can be prevented. In this case, the point defects are preferably formed by introducing protons into the semiconductor layer.

In the third semiconductor substrate, the absorbing portion is preferably distributed non-uniformly along a direction parallel to the one plane of the semiconductor layer.

By so doing, not only does the absorbing portion absorbs the incident beam of light but also it scatters the incident beam of light, so that the intensity of the reflected beam of light can be further reduced. Further, when producing a ridge-type laser device by using the semiconductor substrate, by not providing the absorbing portion on the lower side of the ridge structure in the semiconductor substrate, the pattern accuracy in the photolithography step can be improved without adversely affecting the characteristics of the activation layer of the substrate.

A first method of manufacturing a semiconductor substrate according to the present invention includes the steps of: partially forming a light scattering portion on a first semiconductor layer having a group III nitride as a main component, the light scattering portion formed from a material with different optical index of refraction than that of the group III nitride; and crystal-growing a second semiconductor layer having the group III nitride as a main component on the first semiconductor layer including the light scattering portion, whereby a semiconductor substrate comprising the first semiconductor layer, the light scattering portion and the second semiconductor layer is formed.

In accordance with the first method of manufacturing the semiconductor substrate, since the light scattering portion is formed between the first semiconductor layer and the second semiconductor layer forming the semiconductor substrate, the intensity of the light entering from the substrate surface and then reflected by the substrate back surface, i.e., a reflected beam of light can be reduced. Accordingly, in the photolithography step for the manufacture of a nitride semiconductor device using this semiconductor substrate, the problem of exposing a region of the resist film that is not to be exposed can be avoided, thereby increasing the pattern accuracy and increasing the manufacturing yield of the nitride semiconductor device.

Further, in accordance with the first method of manufacturing the semiconductor substrate, after partially forming the light scattering portion from a material with different index of refraction than that of the first semiconductor layer, i.e. from a different material than that of the first semiconductor layer, the second semiconductor layer is crystal-grown on the first semiconductor layer including the light scattering portion. This makes it possible to prevent the defects and the like present in the first semiconductor layer from being conveyed to the second semiconductor layer. Thus, an excellent crystallinity of the second semiconductor layer can be ensured, thereby also ensuring the excellent crystallinity of the semiconductor substrate having the light scattering portion.

In the first method of manufacturing the semiconductor substrate, the step of partially forming the light scattering portion preferably comprises the step of forming a film on the entire surface of the semiconductor layer to serve as the optical scattering portion, the step of partially forming a mask pattern on the film, etching the film by means of the mask pattern and removing the portions of the film that were not covered by the mask pattern, thereby forming the light scattering portion, and the step of removing the mask pattern.

In this way, the light scattering portion can be reliably formed partially on the first semiconductor layer.

A second method of manufacturing the semiconductor substrate according to the invention comprises the steps of: forming height irregularity on the back surface of a semiconductor layer having a group III nitride as a main component, the height irregularity having a height difference larger than a predetermined value; and forming an imbedded film on the back surface of the semiconductor layer with the height irregularity formed, the imbedded film formed from a material with a different optical index of refraction than that of the group III nitride, whereby a semiconductor substrate comprising the semiconductor layer and the imbedded film is formed.

In accordance with the second method of manufacturing the semiconductor substrate, the height irregularity forming the light scattering potion are formed on the back surface of the semiconductor layer forming the semiconductor substrate, i.e., on the interface between the semiconductor layer and the imbedded film. This makes it possible to reduce the intensity of the light entering from the substrate surface and then reflected by the substrate back surface, i.e., the reflected beam of light. Accordingly, in the photolithography step for the manufacture of the nitride semiconductor device using the semiconductor substrate, the problem of exposing the regions of the resist film that are not to be exposed can be avoided, so that the pattern accuracy can be increased and the manufacturing yield of the nitride semiconductor device can be improved.

Further, in accordance with the second method of manufacturing the semiconductor substrate, since the back surface of the semiconductor layer which was made coarse by the height irregularity can be flattened by the imbedded film, the substrate back surface can be flattened and the manufacturing process of the semiconductor device can be simplified.

Further, in accordance with the second method of manufacturing the semiconductor substrate, when another semiconductor layer having the group III nitride as a main component is crystal-grown as the embedded film, an excellent crystallinity can be obtained in the another semiconductor layer formed on the convex portions of the height irregularity. Accordingly, an excellent crystallinity can be obtained in the semiconductor substrate having the light scattering portion.

A third method of manufacturing the semiconductor substrate according to the invention comprises the steps of: partially forming a light absorbing portion on the first semiconductor layer having the group III nitride as the main component, the light absorbing portion formed from a material with a larger optical absorption coefficient than that of the group III nitride; crystal-growing a second semiconductor layer on the first semiconductor layer including the light absorbing portion, the second semiconductor layer having the group III nitride as the main component, whereby a semiconductor substrate comprising the first semiconductor layer, the light absorbing portion and the second semiconductor layer is formed.

In accordance with the third method of manufacturing the semiconductor substrate, the light absorbing portion is formed between the first semiconductor layer forming the semiconductor substrate and the second semiconductor layer. Accordingly, the light entering from the substrate surface and then reflected by the substrate back surface, i.e., a reflected beam of light can be reduced in intensity. Thus, in the photolithography step for the manufacture of the nitride semiconductor device using this semiconductor substrate, the problem of exposing the regions of the resist film that are not to be exposed can be prevented, whereby the pattern accuracy can be improved and the manufacturing yield of the nitride semiconductor device can be increased.

Further, in accordance with the third method of manufacturing the semiconductor substrate, after partially forming the light absorbing portion from a material with different absorption coefficient than that of the first semiconductor layer, i.e. from a different material than that of the first semiconductor layer, the second semiconductor layer is crystal-grown on the first semiconductor layer including the light absorbing portion. Accordingly, the conveyance of the defects and the like present in the first semiconductor layer to the second semiconductor layer can be prevented by the light absorbing portion. Thus, an excellent crystallinity can be obtained in the semiconductor substrate having the light absorbing portion.

A fourth method of manufacturing the semiconductor substrate in accordance with the invention comprises the step of forming the light absorbing portion by implanting an impurity into the semiconductor layer having the group III nitride as the main component, thereby establishing a level that absorbs light, whereby a semiconductor substrate comprising the semiconductor layer and the light absorbing portion is formed.

In accordance with the fourth method of manufacturing the semiconductor substrate, the light absorbing portion is formed in the semiconductor layer forming the semiconductor substrate, so that the light entering from the substrate surface and then reflected by the substrate back surface, i.e. a reflected beam of light, can be reduced in intensity. This makes it possible to prevent the problem of exposing the regions of the resist film that are not to be exposed in the photolithography step for the manufacture of the nitride semiconductor device using this semiconductor substrate. Accordingly, the pattern accuracy can be increased and therefore the manufacturing yield of the nitride semiconductor device can be improved.

Further, in accordance with the fourth method of manufacturing the semiconductor substrate, since the light absorbing portion is formed by implanting an impurity into the semiconductor layer forming the substrate, the lowering of the crystallinity of the semiconductor substrate having the light absorbing portion can be prevented.

In accordance with the fourth method of manufacturing the semiconductor substrate, the step of forming the light absorbing portion preferably comprises the step of partially forming the light absorbing portion in the semiconductor layer by partially forming a mask pattern on the semiconductor layer and then implanting an impurity into the semiconductor layer with the use of the mask pattern, and the step of removing the mask pattern.

In this manner, the light absorbing portion can be surely formed partially on the semiconductor layer. When a ridge-type laser device is produced using the semiconductor substrate, for example, the pattern accuracy in the photolithography step can be improved without adversely affecting the characteristics of the activation layer on the semiconductor substrate by not providing the absorbing portion on the lower side of the ridge structure of the semiconductor substrate.

A first semiconductor device according to the invention comprises a semiconductor substrate having a group III nitride as a main component and a scattering portion for scattering light entering from one plane of the substrate, the scattering portion provided on another plane or inside of the substrate, and a structure formed on the one plane of the semiconductor substrate by a photolithography and etching of the semiconductor layer of the group III nitride.

In accordance with the first semiconductor device, which employs the first semiconductor substrate according to the invention, no undesired exposure of the resist film occurs during the photolithography step. As a result, the dimensional accuracy of the structure formed on the substrate can be improved and therefore the manufacturing yield of the semiconductor device can be improved.

A second semiconductor device according to the invention comprises a semiconductor substrate having a transmitting portion for transmitting light entering from one plane of the substrate and having a group III nitride as a main component, the transmitting portion provided on another plane of the substrate, and a structure formed on the one plane of the semiconductor substrate by a photolithography and etching of the semiconductor layer of the group III nitride.

In accordance with the second semiconductor device, which employs the second semiconductor substrate according to the invention, no unwanted exposure of the resist film occurs during the photolithography step. Accordingly, the dimensional accuracy of the structure formed on the substrate can be improved and the manufacturing yield of the semiconductor device can be improved.

A third semiconductor device according to the invention comprises a semiconductor substrate having an absorbing portion for absorbing light entering from one plane of the substrate and having a group III nitride as a main component, the absorbing portion provided at least a part of the semiconductor substrate, and a structure formed on the one plane of the semiconductor substrate by a photolithography and etching of the semiconductor layer of the group III nitride.

In accordance with the third semiconductor device, which employs the third semiconductor substrate according to the invention, no undesired exposure of the resist film occurs during the photolithography step. Accordingly, the dimensional accuracy of the structure formed on the substrate can be improved and therefore the manufacturing yield of the semiconductor device can be improved.

In any of the first to the third semiconductor device, the structure may include a ridge structure or a trench structure.

In the third semiconductor device, the structure comprises a ridge structure, and it is preferable that the absorbing portion is not provided at the lower side of the ridge structure of the semiconductor substrate. In this manner, the pattern accuracy of the photolithography step can be improved without adversely affecting the characteristics of the activation layer on the substrate.

A first pattern forming method according to the invention comprises the steps of: forming a semiconductor layer of a group III nitride on one plane of a semiconductor substrate having a scattering portion for scattering light entering from the one plane of the substrate and having the group III nitride as a main component, the semiconductor substrate, the scattering portion provided on another plane or inside of the semiconductor substrate; forming a positive- or negative-type resist film on the semiconductor layer; irradiating the resist film with a exposing beam of light via a photomask having an opening; forming a resist pattern by developing the resist film so that, where the resist film is of the positive type, portions of the resist film that were irradiated by the exposing beam of light are removed and where the resist film is of the negative type, portions of the resist film that were not irradiated by the beam of exposing beam of light are removed; and etching the semiconductor layer by using the resist pattern as a mask.

In accordance with the first pattern forming method, which is a pattern forming method for the manufacture of the semiconductor device using the first semiconductor substrate according to the invention, the problem of exposing the regions of the resist film that are not to be exposed can be prevented. Accordingly, the resist pattern accuracy can be improved and therefore the manufacturing yield of the semiconductor device can be improved.

A second pattern forming method according to the invention comprises the steps of: forming a semiconductor layer of a group III nitride on one plane of a semiconductor substrate having a transmitting portion provided on another plane of the semiconductor substrate for transmitting a beam of light incident from the one plane, the semiconductor substrate comprising the group III nitride as a main component; forming a positive- or negative-type resist film on the semiconductor layer; irradiating the resist film with an exposing beam of light through a photomask having an opening portion; developing the resist film so that, where the resist film is of positive type, portions of the resist film that were irradiated with the exposing beam of light are removed and where the resist film is of negative type, portions of the resist film that were not irradiated with the exposing beam of light are removed, whereby a resist pattern is formed; and etching the semiconductor layer while using the resist pattern as a mask.

In accordance with the second pattern forming method, which is a pattern forming method for manufacturing the semiconductor device using the second semiconductor substrate according to the invention, the problem of exposing the regions of the resist film that are not to be exposed can be prevented. Accordingly, the resist pattern accuracy can be improved and therefore the manufacturing yield of the semiconductor device can be improved.

A third pattern forming method according to the invention comprises the steps of: forming a semiconductor layer of a group III nitride on one plane of a semiconductor substrate provided at least partially with an absorbing portion for absorbing a beam of light incident from the one plane, the semiconductor substrate comprising the group III nitride as a main component; forming a positive- or negative-type resist film on the semiconductor layer; irradiating the resist film with an exposing beam of light through a photomask having an opening; developing the resist film so that, where the resist film is of positive type, portions of the resist film that were irradiated by the exposing light beam are removed and where the resist film is of negative type, portions of the resist film that were not irradiated by the exposing beam of light are removed, whereby a resist pattern is formed; and etching the semiconductor layer while using the resist pattern as a mask.

In accordance with the third pattern forming method, which is a pattern forming method for the manufacture of the semiconductor device using the third semiconductor substrate according to the invention, the problem of exposing the regions of the resist film that are not to be exposed can be prevented. Accordingly, the resist pattern accuracy can be improved and therefore the manufacturing yield of the semiconductor device can be improved.

DETAILED DESCRIPTION OF THE INVENTION

Embodiment 1

Figure 1:
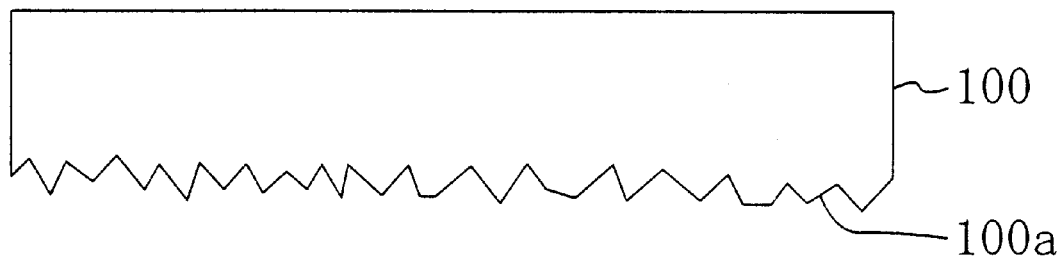
FIG. 1 is a cross sectional view of a semiconductor substrate according to a first embodiment of the invention.

Hereunder, a semiconductor substrate according to a first embodiment of the invention, the method of manufacturing the semiconductor substrate, and a pattern forming method for the manufacture of the semiconductor device using the semiconductor substrate will be described by referring to the drawings.

FIG. 1 shows a cross-section of the semiconductor substrate according to the first embodiment of the invention.

As shown, the semiconductor substrate according to the first embodiment comprises a group III nitride semiconductor layer, specifically a GaN layer 100. The surface of the GaN layer 100 (which may hereunder be referred to as a GaN substrate 100) is a (0001) Ga surface. The back surface of the GaN substrate 100 is (0001) an N surface. The thickness of the GaN substrate 100 is 200 μm, for example.

The first embodiment is characterized in that the back surface of the GaN substrate is coarsely formed with height irregularity 100a. The height irregularity 100a preferably has a height difference of λ/10 or more, where λ is the wavelength of the exposing beam of light used in the photolithography step for the manufacture of the semiconductor device using the GaN substrate 100.

FIGS. 2(A)–(E) show cross sectional views illustrating the respective steps of the method of manufacturing the semiconductor substrate according to the first embodiment of FIG. 1.

Figure 2A:
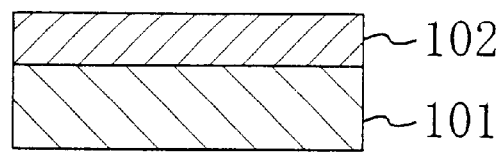
FIGS. 2(A)–(E) are cross sectional views of the semiconductor substrate according to the first embodiment of the invention in the respective steps of its manufacture.

First, as shown in FIG. 2(A), there is prepared a silicon-on-sapphire (hereinafter referred to as an SOS substrate) comprising a sapphire substrate 101 with a thickness of 300 μm and a silicon substrate 102 with a thickness of 80 μm.

Figure 2B:
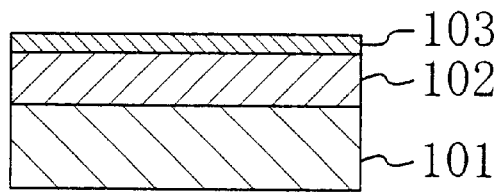

Next, as shown in FIG. 2(B), an AlN layer 103 is grown on the silicon substrate 102 of the SOS substrate to a thickness of 200 nm under the temperature of 1000° C. by the MOVPE (metal organic vapor phase epitaxy) method using trimethylaluminum and ammonia as raw material gases.

Figure 3:
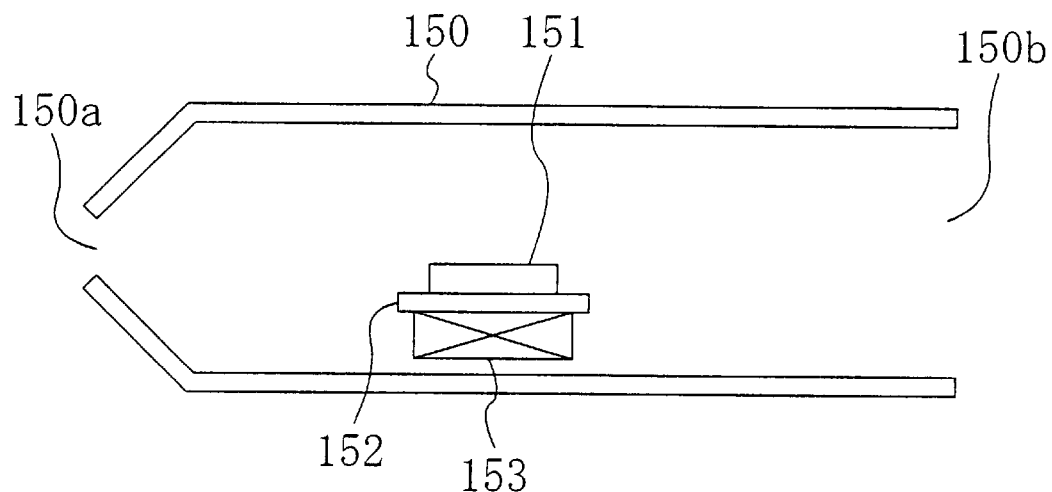
FIG. 3 shows an example of the MOVPE apparatus used in the method of manufacturing the semiconductor substrate according to the first embodiment of the invention.

FIG. 3 shows an example of the MOVPE apparatus used in the manufacture of the semiconductor substrate according to the first embodiment. As shown in FIG. 3, the MOVPE apparatus comprises a reaction pipe 150 made from quarts or stainless and the like, a susceptor 152 on which a processed substrate 151 is placed in the reaction pipe 150, and a heating means 153 for heating the processed substrate 151 via the susceptor 152 in the reaction pipe 150. The reaction pipe 150 comprises a gas inlet 150a for the introduction of the raw material gas and a carrier gas, and a gas outlet 150b for the discharge of used gases. The susceptor 152 is made from graphite, for example. The heating means 153 may comprise a resistance wire heater (resistance heating heater) or a lamp heater, for example.

During the growing of the group III nitride semiconductor layer by the MOVPE method, the group III element plane has a high growth rate, so that the growth of the group III element is dominant. Accordingly, in the step of forming the AlN layer 103 shown in FIG. 2(B), the growth of the Al plane is dominant, with the result that the surface of the AlN layer 103 becomes an Al plane while the back surface of the AlN layer 103, i.e., the plane of the AlN layer 103 facing the silicon substrate 102, becomes an N plane.

Figure 2C:
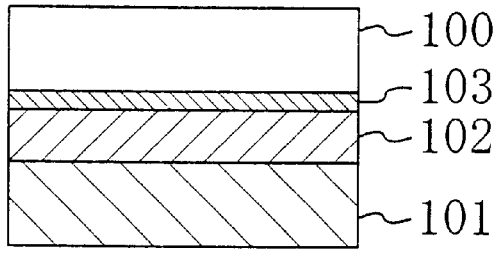

Next, as shown in FIG. 2(C), a GaN layer 100 is grown on the AlN layer 103 to a thickness of 250 μm under the temperature of 1000° C. by the HVPE (hydride vapor phase epitaxy) method using the gallium chloride obtained as a result of reacting an HCl gas with Ga under the temperature of 800° C., and ammonia as raw material gases. Since the surface o the AlN layer 103 is an Al plane, the plane of the GaN layer 100 facing the AlN layer 103, i.e., the back surface of the GaN layer 100, becomes an N plane, while the surface of the GaN layer 100 becomes a Ga plane. Further, since the GaN layer 100 is formed on the SOS substrate including the sapphire substrate 101 and the silicon substrate 102, the compressive stress given by the sapphire substrate 101 to the GaN layer 100 balances with the tensile stress given by the silicon substrate 102 to the GaN layer 100, so that a thick-film GaN layer 100 can be grown without generating cracks.

Figure 4:
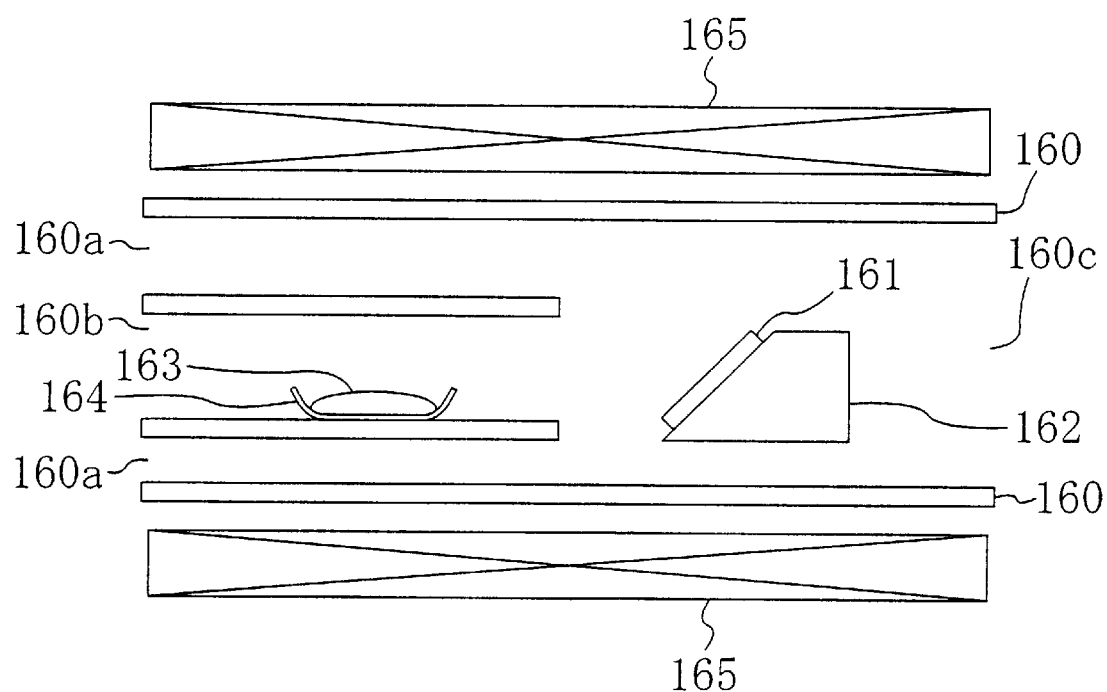
FIG. 4 shows an example of the HVPE apparatus used in the method of manufacturing the semiconductor substrate according to the first embodiment of the invention.

FIG. 4 shows an example of the HVPE apparatus used in the method of manufacturing the semiconductor substrate according to the first embodiment. As shown in FIG. 4, the HVPE apparatus comprises a reaction pipe 160 formed from quarts or the like, a susceptor 162 on which a processed substrate 161 is placed in the reaction pipe 160, a pan 164 in which a molten Ga 163 is placed for reaction with the HCl gas in the reaction pipe 160, and a heating means 165 for heating the inside of the reaction pipe 160 externally. The reaction pipe 160 comprises a first gas inlet 160a for the introduction of ammonia gas and carrier gas, a second gas inlet 160b for the introduction of the HCl gas and the carrier gas, and a gas outlet 160c for the discharge of used gases. The susceptor 162 is made from graphite or quarts, for example, and the pan 164 is made from quarts, for example. The heating means 165 may comprise a tubular resistance-wire heater, for example.

Figure 2D:
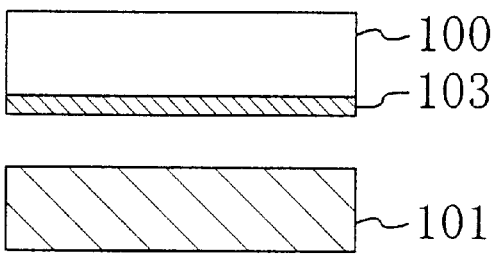

Next, as shown in FIG. 2(D), the sapphire substrate 101 is separated from the GaN substrate 100, i.e., the GaN layer 100 which is to form the nitride semiconductor substrate, by removing only the silicon substrate 102 by a processing with the use of a liquid mixture of hydrofluoric acid and nitric acid. Either side of the GaN substrate 100 is specular without any height irregularity, and the AlN layer 103 is formed on the back surface of the GaN substrate 100.

Figure 2E:
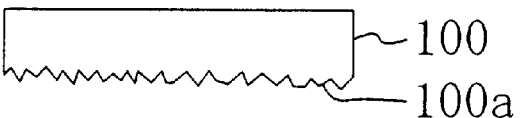

The AlN layer 103 is removed by grinding the back surface of the GaN substrate 100, as shown in FIG. 2(E), and the back surface is then made coarse by forming the height irregularity 100a. The coarsening of the back surface of the GaN substrate 100 can be done by various methods, including, for example, polishing the back surface of the GaN substrate 100 by using an abrasive with a grain size of 10–50 μm, for example. Specifically, in the first embodiment, the back surface of the GaN substrate 100 is polished down to a thickness of the GaN substrate 100 on the order of 200 μm, in order to obtain the semiconductor substrate according to the first embodiment of FIG. 1.

Figure 5:
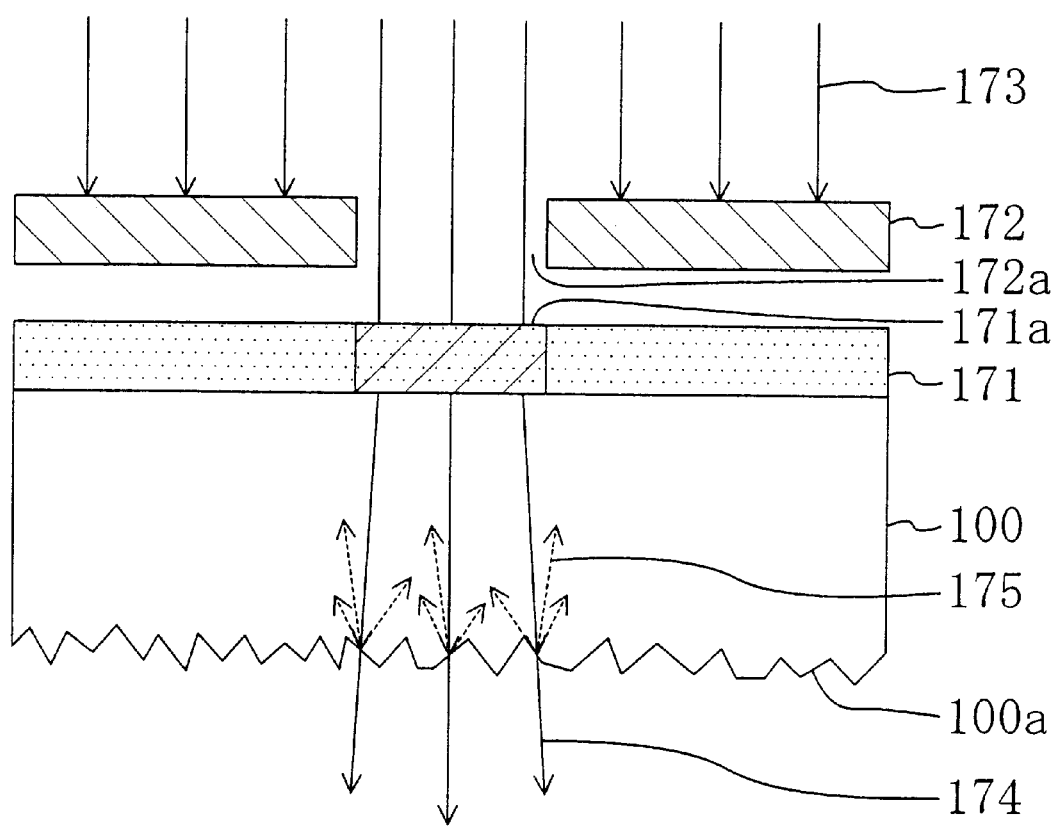
FIG. 5 illustrates the exposure of a resist film formed on the semiconductor substrate according to the first embodiment of the invention.

FIG. 5 illustrates the exposure of the resist film formed on the semiconductor substrate according to the first embodiment of FIG. 1, i.e. the GaN substrate 100.

As shown in FIG. 5, the resist film 171 on the GaN substrate 100 is irradiated with an exposing beam of light 173 of g-line, for example, via a photomask 172 having an opening 172a. The exposing beam of light 173 or incident beam of light 173 incident on the surface of the GaN substrate 100 (which may hereinafter be referred to as a substrate surface) through the resist film 171 splits into an emergent beam of light 174 emerging from the back surface of the GaN substrate 100 (which may hereinafter be referred to as a substrate back surface) and a reflected beam of light 175 caused by the diffusion by the height irregularity 100a on the substrate back surface. A region 171a of the resist film 171 is the region to be exposed by the incident beam of light 173. The exposing apparatus may comprise a contact aligner using the g-line of a mercury lamp as the light source.

The present inventors formed resist films with various back-surface shapes on the GaN substrate, including the semiconductor substrate according to the first embodiment, formed resist patterns by developing the resist films and examined the exterior features of the resist patterns. Hereunder, the results of the examination will be described by referring to FIG. 6.

Figure 6:
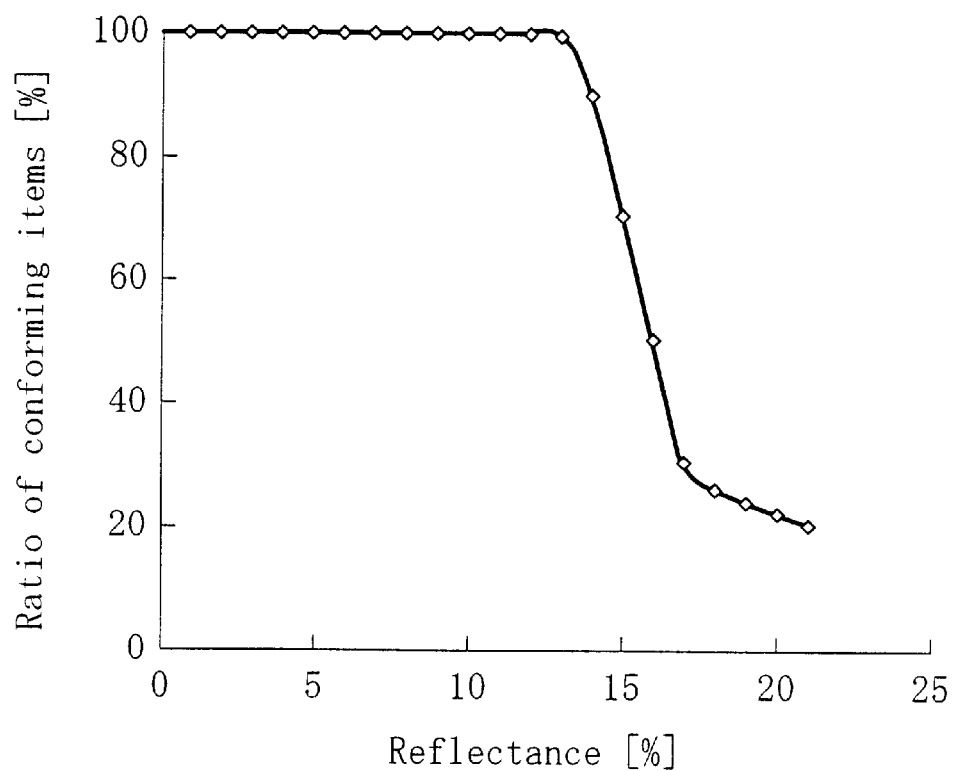
FIG. 6 is a graph showing the relationship between the reflectance of the substrate back surface against the exposing beam of light and the ratio of exteriorly conforming items of the resist pattern forming a line portion, in the case where a line-and-space resist pattern with a line and space portion width of 2 μm was formed on a GaN substrate.

FIG. 6 shows the relationship between the reflectance of the exposing beam of light (g-line) on the substrate back surface and the ratio of exteriorly conforming items of the resist pattern forming the line portion, in the case where a line-and-space resist pattern with a line and space portion thickness of 2 μm is formed on the GaN substrate.

The exteriorly conforming item in this case refers to those resist patterns having a width of 2±0.2 μm. The reflectance of the exposing beam of light on the substrate back surface (hereinafter referred to as a back surface reflectance) is varied by varying the grain diameter of the abrasive or the polishing time in the polishing step for the coarsening of the back surface. The back surface reflectance is indicated as a ratio (measurement value) of the intensity of the reflected beam of light emerging from the substrate surface at an emerging angle of 90° (or substantially 90°) after reflection by the substrate back surface, to the intensity of the incident beam of light incident on the substrate surface at an incident angle of 90° (or substantially 90°). For example, when the back surface of the GaN substrate is so flat that the steps on the atomic layer order can be observed by an atomic force microscopes the back surface reflectance is on the order of 21%. Such an extremely flat surface can be obtained by polishing the back surface of the GaN substrate with an abrasive with an extremely fine grain diameter of less than 1 μm and then heating the back surface to a temperature of about 1000° C. in an atmosphere of ammonia.

As shown in FIG. 6, when the back surface reflectance is 16% or more, the resist film is exposed from below by an intense reflected beam of light, resulting in a peeling of the resist film or a reduction in the size of the resist pattern and thus a lowering of the ratio of exteriorly conforming items. On the other hand, as the back surface reflectance is lowered, the ratio of exteriorly conforming items increases, and a ratio of exteriorly conforming items of substantially 100% is achieved as the back surface reflectance is lowered to 13% or less. Accordingly, by lowering the back surface reflectance to 13%; or less, desired resist patterns can be formed with an yield of substantially 100%.

It will be explained hereunder how the results of FIG. 6 are obtained. When the back surface of the GaN substrate is specular, the back surface reflectance reaches about 20% or more as mentioned above (see the SUMMARY OF THE INVENTION section or FIG. 21). As a result, the resist film is exposed from below by the reflected beam of light from the substrate back surface during the exposure, giving rise to such defects as a peeling of the resist film or a reduction in the resist pattern size. In particular, when the width of the opening of the photomask is not more than several times the wavelength of the exposing beam of light, the reflected beam of light extends somewhat beyond the opening due to the diffraction of the exposing beam of light by the photomask, making it more likely that the region of the resist film that is not to be exposed is exposed. In contrast, when the back surface of the GaN layer forming the substrate is made coarse as in the present embodiment, diffusion is caused by the substrate back surface during the exposure, namely it is difficult for specular reflection to occur on the substrate back surface. This makes the back surface reflectance to decrease, so that there is little unwanted exposing light coming from the back of the resist film, making possible the formation of a resist pattern with no exterior defects.

Thus, in accordance with the first embodiment, because the height irregularity 100a is formed on the back surface of the GaN substrate 100 to make the back surface coarse, it is difficult for specular reflection of the incident beam of light 173 to occur on the back surface of the GaN substrate 100 and the back surface reflectance can be surely reduced. Accordingly, the intensity of the reflected beam of light 175 decreases, so that the problem of exposing the regions (i.e., regions other than the region 171a) of the resist film 171 that is not to be exposed by the reflected beam of light 175 can be avoided. Hence the pattern accuracy of the resist pattern formed by the resist film 171 can be increased and also the pattern accuracy in the photolithography step for the manufacture of the semiconductor device using the GaN substrate 100 can be improved. Thus, the manufacturing yield of the nitride semiconductor device can be improved.

It should be noted that in the first embodiment, while the height irregularity 100a was formed on the back surface of the GaN substrate 100 to make the back surface coarse and thereby reduce the back surface reflectance, the back surface reflectance can be reduced by other means. For example, a dielectric substance may be sprayed non-uniformly on the substrate back surface, or spherical or otherwise irregularly shaped substance may be provided on the substrate back surface. Alternatively, a low-reflectance film may be formed on the substrate back surface. It should be noted, however, that the lowering of the back surface reflectance by those means tends to be a cause for the introduction of impurities into various elements and the like during the subsequent semiconductor process. Accordingly, it is preferable to lower the back surface reflectance by the coarsening of the back surface of the GaN substrate 100.

Furthermore, while in the first embodiment the coarsening of the back surface of the GaN substrate 100 was produced by polishing, this can be replaced by other means such as sandblasting or etching.

Moreover, the first embodiment is based on the realization that the problem of unwanted exposure of the resist film is caused by the exposing beam of light entering the substrate surface at an incident angle of 90° (or substantially 90°), reflected by the substrate back surface and eventually emerging from the substrate surface at an emerging angle of 90° (or substantially 90°). Accordingly, the manner of coarseness of the substrate back surface may be arbitrary as long as it can reduce the reflectance of the substrate back surface with respect to the exposing beam of light entering the substrate surface at an incident angle of 90°. The substrate back surface, however, should preferably have such coarseness as to produce diffusion. This is because of the possibility that, if the coarseness of the substrate back surface is such that the exposing beam of light entering the substrate surface at an incident angle of 90° is reflected at a particular angle with respect to the substrate surface or substrate main plane, regions other than a predetermined exposure region of the resist film may be exposed. Specifically, the exposing beam of light entering the substrate surface at an incident angle of 90° can be scattered in all directions or diffused by providing height irregularity on the substrate back surface with a height difference of about $\frac{1}{10}$ or more of the wavelength of the exposing beam of light. It is also preferable that the height irregularity provided on the substrate back surface is such that the back surface reflectance is about 13% or less.

Further, the kind of the exposing beam of light used in the photolithography step is not particularly limited. However, a significantly improved pattern accuracy can be obtained as compared with the prior art by using light with certain wavelengths that can propagate through the GaN substrate 100 without being absorbed, such as the g- or i-line, as the exposing beam of light.

In the first embodiment, the resist film used in the photolithography step may be either positive or negative type.

Also in the first embodiment, while GaN was used as the material for the nitride semiconductor substrate, any group III nitride semiconductor made from GaN, InN and AlN either individually or in combination as a mixed crystal may be used. The substrate may include other substances as long as such a group III nitride semiconductor as mentioned above constitutes the main component of the substrate.

Embodiment 2

A semiconductor substrate according to a second embodiment of the invention, a method of manufacturing the semiconductor substrate, and a pattern forming method for the manufacture of a semiconductor device using the semiconductor substrate will hereinafter be described by referring to the drawings.

Figure 7:
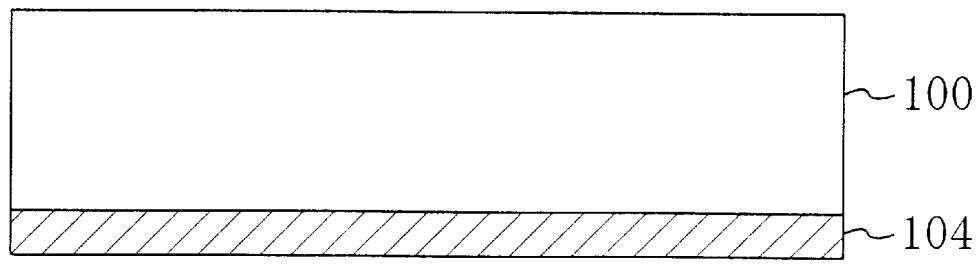
FIG. 7 is a cross sectional view of a semiconductor substrate according to a second embodiment of the invention.

FIG. 7 is a cross sectional view of the semiconductor substrate according to the second embodiment.

As shown, the semiconductor substrate according to the second embodiment comprises a group III nitride semiconductor layer, specifically a GaN layer 100 (which may hereinafter be referred to as a GaN substrate 100). The surface of the GaN substrate 100 is a (0001) Ga plane. The back surface of the GaN substrate 100 is (0001) an N plane. The thickness of the GaN substrate 100 is 300 $\mu$m, for example.

The semiconductor substrate according to the second embodiment is characterized in that an aluminum oxide ($Al_2O_3$) layer 104 with a thickness of 200 nm is provided on the back surface of the GaN substrate 100 to function as an anti-reflection film against the exposing beam of light of the g- or i-line. The aluminum oxide layer 104, as opposed to sapphire and the like, has a polycrystalline or an amorphous structure, while its index of refraction is 1.68, which is about the same as that of sapphire. To serve as an anti-reflection film means that it prevents the reflection of the incident beam of light entering from the surface of the GaN substrate 100 by the back surface thereof, while allowing the transmission of the light through the anti-reflection film to emerge from the back surface of the film Thus, the anti-reflection film preferably has a transmittance of 80% or more.

The method of manufacturing the semiconductor substrate according to the second embodiment of FIG. 7 is as follows. It should be noted that this method is substantially the same as that for the first embodiment up to the step shown in FIG. 2(D) of FIGS. 2(A)–(E).

Specifically, as shown in FIG. 2(A), first there is prepared the SOS substrate including the sapphire substrate 101 and the silicon substrate 102, and then, as shown in FIG. 2(B), the AlN layer 103 is grown on the silicon substrate 102 of the SOS substrate to the thickness of 200 nm by the MOVPE method using the trimethylaluminum and ammonia as the raw material gases. Thereafter the GaN layer 100 is grown on the AlN layer 103 to a thickness of 300 $\mu$m by the HVPE method using the gallium chloride and ammonia as the raw material gases, as shown in FIG. 2(C). This is followed by the removal of only the silicon substrate 102, as shown in FIG. 2(D), whereby the sapphire substrate 101 is separated from the GaN layer 100 forming the nitride semiconductor substrate, i.e. the GaN substrate 100. Either side of the GaN substrate 100 is specular and without any height irregularity, while on the back surface of the GaN substrate 100 is formed the AlN layer 103.

Next, the GaN substrate 100 including the AlN layer 103 is heated at a temperature of 600° C. for ten minutes in an atmosphere of water vapor and nitrogen with the partial pressures of 10% and 90%, respectively, at atmospheric pressure. This allows the AlN layer 103 to be selectively oxidized to form an aluminum oxide layer 104 with a thickness of 200 nm. Thus the semiconductor substrate according to the second embodiment shown in FIG. 7 is completed.

The present inventors formed a line-and-space resist pattern similar to the one of first embodiment on the semiconductor substrate according to the second embodiment via a processed film by exposure using the g-line, and then etched the processed film using the resist pattern as the mask. This resulted in the size of the patterned processed film falling substantially completely within a predetermined range. The examination of the reflectance of the back surface of the semiconductor substrate according to the second embodiment revealed a very low value of about 0.5% or less, which presumably accounted for the satisfactory formation of the pattern.

Specifically, in accordance with the second embodiment, the aluminum oxide layer 104 formed on the back surface of the GaN substrate 100 functions as the anti-reflection film and therefore the back surface reflectance decreases, whereby the intensity of the light entering from the substrate surface and then reflected by the substrate back surface can be reduced. Accordingly, the problem of exposing the regions of the resist film other than the predetermined exposed regions by the exposing beam of light incident on the substrate surface and reflected by the substrate back surface during the photolithography step for the manufacture of the semiconductor device using the GaN substrate 100. Thus the pattern accuracy in the photolithography step can be improved and therefore the manufacturing yield of the nitride semiconductor device can be increased.

Further, in accordance with the second embodiment, the aluminum oxide layer 104 is formed by oxidizing the AlN layer 103, which had been formed on the back surface of the GaN substrate 100 when the GaN substrate 100 was formed. As a result, the process can be simplified as compared with the case where the anti-reflection film is newly formed on the back surface of the GaN substrate 100, and also the manufacturing yield of the GaN substrate 100 can be improved because the possible introduction of impurities into the GaN substrate 100 is prevented.

While in the second embodiment the aluminum oxide was used as the material for the anti-reflection film, other materials such as $SiO_2$ or SiN may be used instead. Some conditions for realizing a low-reflectance anti-reflection film with the use of those materials follow. First, the thickness of the anti-reflection film should preferably be an odd multiple of the ¼ wavelength of the wavelength of the exposing beam of light in the anti-reflection film. Second, the index of refraction of the anti-reflection film should preferably be different from that of the nitride semiconductor substrate (the GaN substrate in the present embodiment), and this difference in the index of refraction should preferably be as great as possible. Particularly, the index of refraction of the anti-reflection film should preferably be not more than about 9/10 that of the nitride semiconductor substrate. For example, in the present embodiment, the index of refraction of the aluminum oxide layer 104 constituting the anti-reflection film is 1.68, and the thickness 200 nm of the aluminum oxide layer 104 is equivalent to three fourth the wavelength of the g-line in the anti-reflection film (436 nm/1.68). Since the difference in the indexes of refraction between the aluminum oxide layer 104 (1.68) and the GaN substrate 100 (about 2.5) is relatively large, the tolerable range of the thickness for obtaining a back surface reflectance of 13% or less, i.e., the tolerable range of the thickness for ensuring an improvement in the pattern accuracy during the photolithography step, is relatively wide. Specifically, when the thickness of the aluminum oxide layer 104 is set by targeting the ¼ wavelength of the wavelength of the exposing beam of light in the aluminum oxide layer 104, the tolerable thickness range for producing the back surface reflectance of 13% or less is about the ¼ wavelength±⅛ wavelength. This is, in the case where the g-line is used for exposure, about 65 nm±40 nm.

Tables 1 and 2 show the characteristics of various anti-reflection films examined by the inventors, where the i- and g-lines were used as the exposing beam of light. It should be noted that those characteristics were in each case obtained when the thickness of the anti-reflection film was set by targeting the ¼ wavelength of the wavelength of the exposing beam of light in the anti-reflection film and when the GaN substrate was used as the nitride semiconductor substrate.

TABLE 1

| Type of anti-reflection film | Index of refraction against i-line (wavelength 365 nm) | Film thickness corresponding to ¼ wavelength of i-line in anti-reflection film | Reflectance against i-line when film thickness corresponds to ¼ wavelength of i-line | Range of film thickness that can produce index of refraction of 13% or less against i-line |
|---|---|---|---|---|
| $SiO_2$ | 1.47 | 62 nm | 0.5% | 25–99 nm |
| $Al_2O_3$ | 1.68 | 54 nm | 0.4% | 22–86 nm |
| SiN | 2.05 | 45 nm | 6.5% | 22–67 nm |
| $ZrO_2$ | 2.12 | 43 nm | 8.2% | 23–63 nm |
| $Al_{0.5}Ga_{0.5}N$ | 2.32 | 39 nm | 13% | 38–41 nm |
| $Al_{0.1}Ga_{0.9}N$ | 2.45 | 37 nm | 17% | None |
| $TiO_2$ | 2.70 | 33 nm | 24% | None |

TABLE 2

| Type of anti-reflection film | Index of refraction against g-line (wavelength 436 nm) | Film thickness corresponding to ¼ wavelength of g-line in anti-reflection film | Reflectance against g-line when film thickness corresponds to ¼ wavelength of g-line | Range of film thickness that can produce index of refraction of 13% or less against g-line |
|---|---|---|---|---|
| $SiO_2$ | 1.47 | 74 nm | 0.5% | 30–118 nm |
| $Al_2O_3$ | 1.68 | 65 nm | 0.4% | 26–104 nm |
| SiN | 2.05 | 53 nm | 6.5% | 26–80 nm |
| $ZrO_2$ | 2.09 | 52 nm | 9.3% | 25–78 nm |
| $Al_{0.5}Ga_{0.5}N$ | 2.32 | 47 nm | 13% | 45–49 nm |
| $Al_{0.1}Ga_{0.9}N$ | 2.44 | 45 nm | 17% | None |
| $TiO_2$ | 2.45 | 44 nm | 17% | None |

As will be seen from Tables 1 and 2, no satisfactory effect as the anti-reflection film can be obtained unless the index of refraction of the anti-reflection film is made not more than 2.32, which is smaller than the index of refraction of GaN (2.5). Further, as the index of refraction of the anti-reflection film becomes smaller than that of GaN, the reflectance (back surface reflectance) reducing effect, i.e., the anti-reflection effect, becomes larger while simultaneously expanding the tolerable range of the thickness for making the back surface reflectance 13% or less. It should be noted that in Tables 1 and 2, the fact that the index of refraction of the anti-reflection film in the cases of $TiO_2$ and $ZrO_2$ varies depending on whether the g-line or i-line is used is due to a larger wavelength dispersion near the wavelengths of the g- and i-lines in the cases of $TiO_2$ and $ZrO_2$.

In the second embodiment, the anti-reflection film may be formed by a laminated member composed of a plurality of layers with different indexes of refraction than that of the group III nitride forming the substrate. In this case, it is preferable that at least two of the layers forming the laminated member have different indexes of refraction.

Further, in the second embodiment, the type of the exposing beam of light used in the photolithography step is not particularly limited. However, by using light with certain wavelengths that can propagate through the GaN substrate 100 without being absorbed, such as the g- or i-line, as the exposing beam of light, the pattern accuracy can be greatly increased as compared with the prior art.

In the second embodiment, the resist film used in the photolithography step may be either positive or negative type.

While in the second embodiment, GaN was used as the material for the nitride semiconductor substrate, any group III nitride semiconductor made from GaN, InN and AlN either individually or in combination as a mixed crystal may be used. In this case, the substrate may include other materials as long as the group III nitride as mentioned above constitutes the main component of the substrate.

(Variation of the Second Embodiment)

Hereunder a semiconductor substrate according to a variation of the second embodiment and a method of manufacturing the same will be described by referring to the drawings.

The variation of the second embodiment differs from the second embodiment in that a gallium oxide ($Ga_2O_3$) layer is used as the anti-reflection film against the exposing beam of light of g- or i-line, instead of the aluminum oxide layer.

Figure 8A:
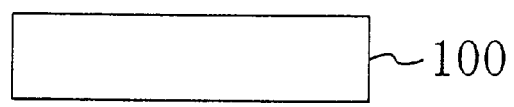
FIGS. 8(A)–(C) are cross sectional views of the semiconductor substrate according to a variation of the second embodiment of the invention in its respective manufacturing steps.
Figure 8B:
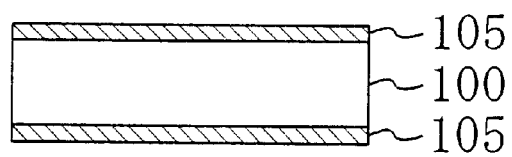
Figure 8C:
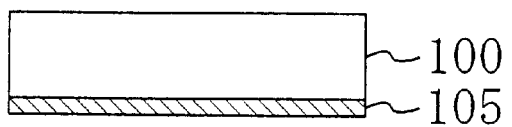

FIGS. 8(A)–(C) are cross sectional views illustrating the respective steps of the method of manufacture of the semiconductor substrate according to the variation of the second embodiment. This manufacturing method is substantially the same as that for the first embodiment as shown in FIGS. 2(A)–(E) except for the step shown in FIG. 2(E).

Specifically, as shown in FIG. 2(A), there is first prepared the SOS substrate including the sapphire substrate 101 and the silicon substrate 102. This is followed by the growing of the AlN layer 103 on the silicon substrate 102 of the SOS substrate to the 200 nm thickness by the MOVPE method using trimethylaluminum and ammonia as the raw material gases, as shown in FIG. 2(B). Thereafter the GaN layer 100 is grown on the AlN layer 103 to the 300 µm thickness by the HVPE method using gallium chloride and ammonia as the raw material gases, as shown in FIG. 2(C). The silicon substrate 102 is then removed as shown in FIG. 2(D), thereby separating the sapphire substrate 101 from the GaN layer 100 forming the nitride semiconductor substrate, i.e. the GaN substrate 100.

Next, as shown in FIG. 8(A), the AlN layer 103 is removed by polishing while the back surface of the GaN substrate 100 is made specular by polishing. Thereafter the GaN substrate 100 is heated at a temperature of 700° C. for ten minutes in an atmosphere of oxygen and nitrogen with the partial pressure of 10% and 90%, respectively, at atmospheric pressure. This allows either side of the GaN substrate 100 to be oxidized, thereby forming a gallium oxide layer 105 with a thickness of 70 nm on the either side, as shown in FIG. 8(B).

Since the formation of the gallium oxide layer 105 on either side of the GaN substrate 100 adversely affects the subsequent device processings, the gallium oxide layer 105 on the surface side of the GaN substrate 100 is removed by the following manner. Specifically, the GaN substrate 100 with the gallium oxide layer 105 on either side is introduced into a crystal growing apparatus such as an MOVPE apparatus shown in FIG. 3. The back surface of the GaN substrate 100 is placed in close contact with the susceptor such that there is no gap between the back surface of the GaN substrate 100 and the susceptor. The GaN substrate 100 is then heated to a temperature of 1000° C. in an atmosphere of hydrogen. This allows the gallium oxide layer 105 on the surface side of the GaN substrate 100 to be reduced while Ga is sublimed, thereby exposing a clean GaN plane on the surface of the GaN substrate 100. On the other hand, the gallium oxide layer 105 on the back surface side of the GaN substrate 100, which is in close contact with the susceptor and therefore tends not to contact hydrogen, is hardly reduced or sublimed. As a result, as shown in FIG. 8(C), the GaN substrate 100 having the gallium oxide layer 105 on the back surface, i.e., the semiconductor substrate according to the variation of the second embodiment, can be obtained.

In accordance with the variation of the second embodiment, since the gallium oxide layer 105 is formed on the back surface of the GaN substrate 100 to function as the anti-reflection film, the back surface reflectance can be reduced and therefore the intensity of the light incident on the substrate surface and then reflected by the substrate back surface can be reduced. Accordingly, the problem of exposing the regions of the resist film other than the predetermined exposure regions by the exposing beam of light incident on the substrate surface and reflected by the substrate back surface can be avoided during the photolithography step for the manufacture of the semiconductor device using the GaN substrate 100. Thus the pattern accuracy in the photolithography step can be improved and therefore the manufacturing yield of the nitride semiconductor device can be increased.

Further, in accordance with the variation of the second embodiment, the formation of the gallium oxide layer 105 by the oxidation of the GaN substrate 100 makes it possible to simplify the process as compared with the case where the anti-reflection film is newly formed on the back surface of the GaN substrate 100. At the same time, the manufacturing yield of the GaN substrate 100 can be increased because the possible introduction of impurities into the GaN substrate 100 is prevented.

Furthermore, in accordance with the variation of the second embodiment, the gallium oxide layer 105 can be formed on the surface side of the GaN substrate 100 prior to the formation of a device using the GaN substrate 100, so that the surface of the GaN substrate 100 can be protected by the gallium oxide layer 105. When forming the device using the GaN substrate 100, the gallium oxide layer 15 on the surface side of the substrate can be reduced and removed in the crystal growing apparatus to thereby expose a clean GaN plane. This makes it possible to sequentially form device structures such as a cladding layer and an active layer on the clean GaN plane.

Embodiment 3

Hereunder a semiconductor substrate according to a third embodiment of the invention, a method of manufacturing the semiconductor substrate, and a pattern forming method for the manufacture of a semiconductor device using the semiconductor substrate will be described by referring to the drawings.

Figure 9:
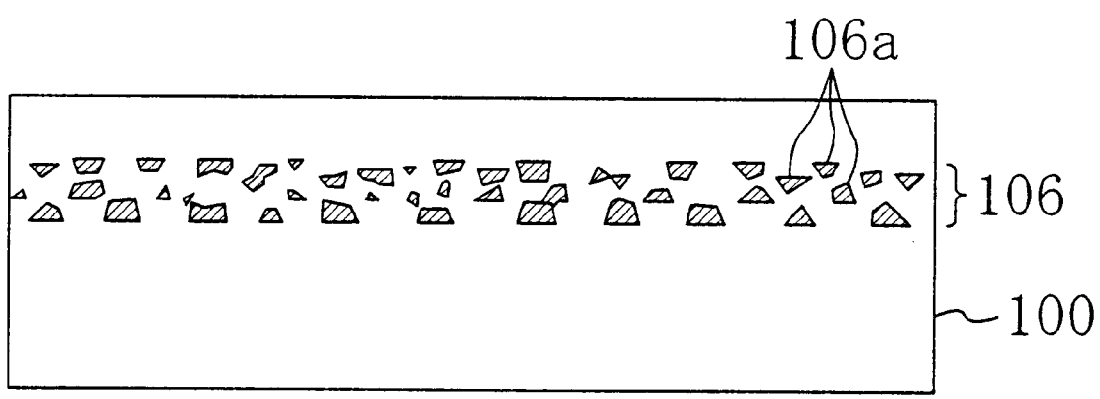
FIG. 9 is a cross sectional view of the semiconductor substrate according to a third embodiment of the invention.

FIG. 9 shows a cross sectional view of the semiconductor substrate according to the third embodiment.

As shown in FIG. 9, the semiconductor substrate according to the third embodiment of the invention comprises a group III nitride semiconductor layer, specifically a GaN layer 100. The surface of the GaN layer 100 (which may hereafter referred to as a GaN substrate 100) is a (0001) Ga plane, while the back surface of the GaN substrate 100 is an (0001) N plane. The thickness of the GaN substrate 100 is 300 µm, for example.

The third embodiment is characterized in that a plurality of $SiO_2$ grains 106a of a material such as $SiO_2$, which has a different index of refraction than that of GaN with respect to an exposing beam of light such as g- or i-line, are discontinuously embedded in a region of the GaN substrate 100 50–80 μm below the surface. The plurality of $SiO_2$ grains 106a form a light scattering portion (which scatters the light incident on the substrate surface). The shape of each $SiO_2$ grain 106a is not particularly limited, but in the third embodiment, the diameter of each $SiO_2$ grain 106a (on a plane parallel to the surface of the GaN substrate 100) is on the order of several tens of a micrometer, and its height (along a direction perpendicular to the surface of the GaN substrate 100) is on the order of 100 nm.

FIGS. 10(A)–(E) are cross sectional views illustrating the respective steps of the method of manufacturing the semiconductor substrate according to the third embodiment, i.e., the semiconductor substrate shown in FIG. 9. This method of manufacturing the semiconductor substrate according to the third embodiment is substantially the same as that for the first embodiment shown in FIGS. 2(A)–(E) up to the step shown in FIG. 2(D).

First as shown in FIG. 2(A), there is prepared the SOS substrate including the sapphire substrate 101 and the silicon substrate 102, and then the AlN layer 103 is grown on the silicon substrate 102 of the SOS substrate to the 200 nm thickness by the MOVPE method using trimethylaluminum and ammonia as the raw material gases, as shown in FIG. 2(B). This is followed by the growing of the GaN layer 100 on the AlN layer 103 to a thickness of 220 μm by the HVPE method using gallium chloride and ammonia as the raw material gases, as shown in FIG. 2(C). At this time, the GaN layer 100 has a surface which is a (0001) Ga plane. Thereafter the silicon substrate 102 is removed as shown in FIG. 2(D), whereby the sapphire substrate 101 is separated from the GaN layer 100 forming the nitride semiconductor substrate, i.e. the GaN substrate 100.

Figure 10:
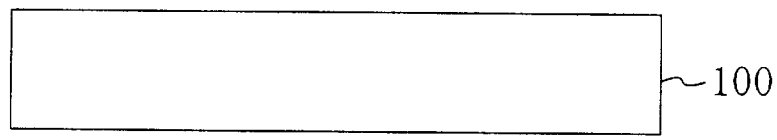
FIGS. 10(A)–(E) are cross sectional views of a semiconductor substrate according to a third embodiment of the invention in its respective manufacturing steps.
Figure 10:
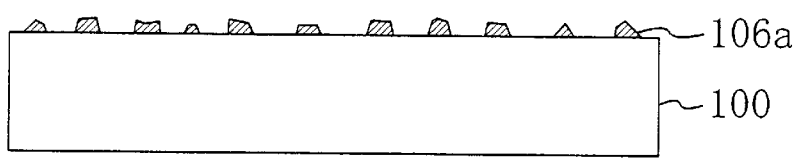
Figure 10:
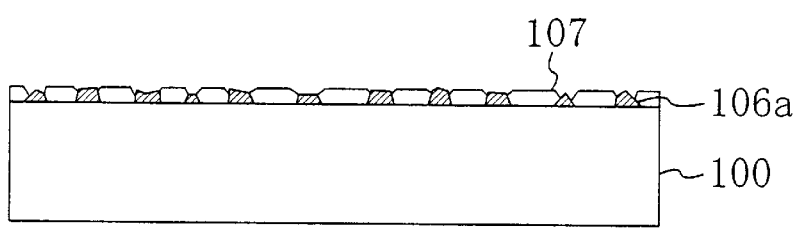
Figure 10:
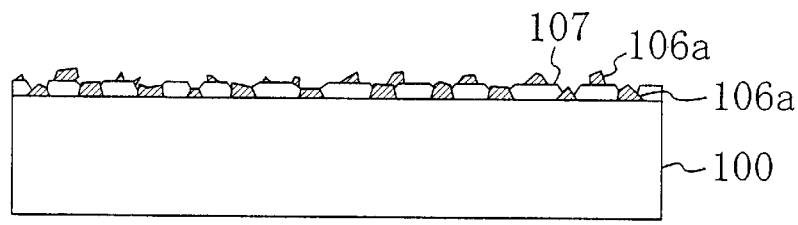
Figure 10:
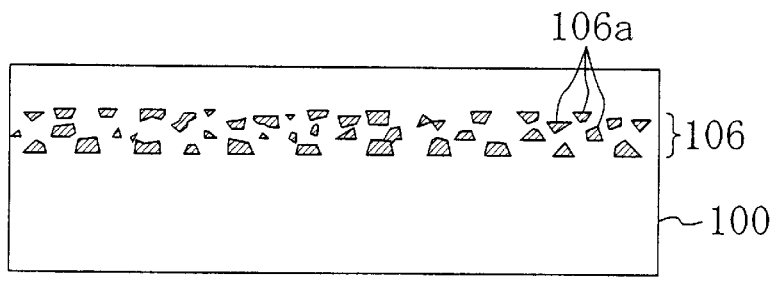

Next, as shown in FIG. 10(A), the AlN layer 103 is removed by polishing, while the back surface of the GaN substrate 100 is made specular by a polishing using an abrasive with an extremely fine grain diameter.

Then, as shown in FIG. 10(B), the plurality of $SiO_2$ grains 106a are deposited on the GaN substrate 100 by an RF (radio frequency) sputtering method using argon gas. In the third embodiment, the gab pressure was set at 0.2 Pa and the RF output was set at 200W as conditions for the deposition of the $SiO_2$ grains 106a. The deposition conditions of the $SiO_2$ grains 106a differ depending on the sputtering apparatus used; it is preferable, however, to employ such conditions that the $SiO_2$ grains deposited have as much grain diameter as possible, because the discontinuous deposition of the $SiO_2$ grains is difficult under the condition where an $SiO_2$ layer is uniformly deposited. In the case of RF sputtering, it is generally preferable to increase the diameter of the spattered grain by increasing the RF output. In this case, however, the gas pressure should preferably be lowered, for an increased RF output tends to destabilize discharge.

An important point in the third embodiment is to terminate the deposition of the $SiO_2$ grains 106a in the step of FIG. 10(B) before the GaN substrate 100 is completely covered by the $SiO_2$ grains 106a. The timing of termination of the deposition of the $SiO_2$ grains 106a determines the arrangement of the $SiO_2$ grains 106a. For example, if the deposition of the $SiO_2$ grains 106a is stopped immediately before the GaN substrate 100 is completely covered by the $SiO_2$ grains 106a, there arises a condition where openings are present at arbitrary points in the $SiO_2$ layer covering the GaN substrate 100. If the deposition of the $SiO_2$ grains 106a is stopped before the covering of the GaN substrate 100 by the $SiO_2$ grains 106a progresses, a plurality of scattered islands of $SiO_2$ grains 106a arise on the GaN substrate 100. In the third embodiment, the arrangement of the $SiO_2$ grains 106a is not particularly limited; however, in the case of making devices in which electrodes are provided on either side of the GaN substrate 100 and current is flown in the thickness direction, it is naturally preferable to reduce the area covered on the GaN substrate 100 by the $SiO_2$ grains 106a as much as possible.

Next, the GaN substrate 100 provided with the $SiO_2$ grains 106a is introduced into the GaN crystal growing apparatus such as the MOVPE apparatus, where, as shown in FIG. 10(C), a GaN layer 107 is grown on the GaN substrate 100 such that the spaces between the $SiO_2$ grains 106a are filled. Specifically, in the MOVPE apparatus, the GaN layer 107 is grown at a temperature of 1000° C. by using trimethylgallium and ammonia as raw material gases, together with hydrogen as a carrier gas. The growth conditions for the GaN layer 107 differ depending on the crystal growing method used. However, in the present embodiment where the MOVPE method is used, the crystal growing temperature is set at 900° C. or more and the group V/group III raw-material supply ratio (ratio of the supply flow rate of ammonia per minute to the supply flow rate of trimethylgallium per minute) is set at 1000 or more. This way, the migration of the group-III raw material (Ga) can be activated, whereby the GaN layer 107 can be grown in such a manner as to fill the spaces between the $SiO_2$ grains 106a. While the surface of the GaN layer 107 can be flattened if the GaN layer 107 is grown to a thickness of the order of 10 μm, the crystal growth of the GaN layer 107 is ended before a completely flat surface of the GaN layer 107 is obtained in the third embodiment.

Thereafter, as shown in FIG. 10(D), $SiO_2$ grains 106a are newly deposited on the GaN layer 107 (including the already deposited $SiO_2$ grains 106a) by an RF sputtering method. The GaN substrate 100 is then re-introduced into the GaN crystal growing apparatus, where a crystal growth of a GaN layer 107 occurs. In the third embodiment, the deposition of the $SiO_2$ grains 106a and the crystal growth of the GaN layer 107 are repeated until the thickness of the GaN layer 107 reaches about 30 μm. Specifically, the RF sputtering for the deposition of the $SiO_2$ grains 106a is effected six times in total, in order to form a light scattering portion 106 comprising the $SiO_2$ grains 106a embedded in the GaN layer 107, as shown in FIG. 10(E). Then, the GaN layer 107 is further crystal-grown to a thickness of about 50 μm by the HVPE method using gallium chloride and ammonia as raw material gases, thereby completing the semiconductor substrate according to the third embodiment as shown in FIG. 9. In FIG. 10(E), the GaN layer 107 is not shown, because the GaN layer 107 is eventually integrated with the GaN substrate 100, which is formed from the same material.

In the third embodiment, the crystal growth of the GaN layer 107 was stopped before the surface of the GaN layer 107 was made completely flat by the filling of the spaces between the $SiO_2$ grains 106 by the GaN layer 107. If the spaces between the $SiO_2$ grains 106a are filled by crystal-growing the GaN layer 107 such that the surface of the GaN layer 107 is completely flat, the $SiO_2$ grains 106a are distributed in a laminar manner.

The present inventors formed a line-and-space resist pattern, similar to the one used in the first embodiment, on the semiconductor substrate according to the third embodiment via a processed film by exposure using g-line. When the processed film was etched using the resist pattern as the mask, it was found that the size of the patterned processed film can almost completely fall within a predetermined range by setting the transmittance of the light scattering portion 106 at 80% or less. This is because the light incident on the substrate surface passes through the light scattering portion 106 twice before it is reflected by the substrate back surface and return to the substrate surface. Namely, even though the transmittance of the light scattering portion 106 is 80% and the back surface reflectance on the specular plane of the substrate back surface is about 20%, the net back-surface reflectance is 20%×80%×80% 13%, thus allowing the satisfactory pattern formation to occur.

Thus, in accordance with the third embodiment, the intensity of the light incident on the substrate surface and then reflected by the substrate back surface can be reduced by the light scattering portion 106 formed inside the GaN substrate 100. This makes it possible to avoid the problem of exposing the regions of the resist film other than the predetermined exposure regions by the exposing beam of light incident on the substrate surface and reflected by the substrate back surface, in the photolithography step for the manufacture of the semiconductor device using the GaN substrate 100. Accordingly, the pattern accuracy in the photolithography step can be improved and therefore the manufacturing yield of the nitride semiconductor device can be increased.

In accordance with the third embodiment, after forming the $SiO_2$ grains 106a of a different material from that of the GaN substrate 100 partially on the GaN substrate 100, a GaN layer (GaN layer 107) is newly crystal-grown on the GaN substrate 100 including the $SiO_2$ grains 106a such that the GaN layer becomes part of the substrate. Accordingly, conveyance of any defects and the like present in the original GaN substrate 100 to the GaN layer can be prevented by the $SiO_2$ grains 106a. Thus, a satisfactory crystallinity of the GaN layer 107 can be ensured and therefore a satisfactory crystallinity of the nitride semiconductor substrate having the light scattering portion can be ensured.

While in the third embodiment the deposition of the $SiO_2$ grains 106a and the crystal-growth of the GaN layer 107 were each repeated a plurality of times, they may be each repeated at least one as long as the light scattering portion 106 has a transmittance of 80% or less with respect to the exposing beam of light such as g- or i-line. Since the transmittance of the light scattering portion varies in a complex manner depending on the shape and density or the like of the $SiO_2$ grains 106a, it is difficult to theoretically determine the shape and density or the like of the $SiO_2$ grains 106a so that the light scattering portion 106 has the desired transmittance. Accordingly, it is preferable to experimentally determine, for example, such a number of deposition of the $SiO_2$ grains 106a or such thickness of the region where the $SiO_2$ grains 106a are embedded that the desired transmittance of the light scattering portion 106 can be obtained.

In the third embodiment, the $SiO_2$ grains 106 naturally formed by the RF sputtering method were used as the light scattering portion 106. However, the method of forming the light scattering portion is not particularly limited. For example, after forming the $SiO_2$ layer on the entire surface of the GaN substrate, a mask pattern can be partially formed on the $SiO_2$ layer. The $SiO_2$ layer can be etched using the mask pattern, thereby removing the portions of the $SiO_2$ layer not covered by the mask pattern and forming the light scattering portion from the patterned $SiO_2$ layer, when the mask pattern is removed. When using the $SiO_2$ grains as the light scattering portion, the diameter of each $SiO_2$ grain should preferably be about 1/10 or more of the wavelength of the exposing beam of light. When using the patterned $SiO_2$ layer as the light scattering portion, the width of the $SiO_2$ layer along a direction parallel to the substrate surface, or the thickness of the $SiO_2$ layer, should preferably be about 1/10 or more of the wavelength of the exposing beam of light. Regardless of whether the $SiO_2$ grains or the patterned $SiO_2$ layer is used as the light scattering portion, the thickness of the light scattering portion should preferably be 1/10 or more of the wavelength of the exposing beam of light.

While in the third embodiment $SiO_2$ was used as the material for the light scattering portion, the material for the light scattering portion is not particularly limited as long as it is capable of having the GaN layer crystal-grown thereon and has a different index of refraction than the of GaN. For example, Si, SiN or $Al_2O_3$ may be used instead of $SiO_2$. The light scattering portion does not have to be grains or layer made from single material. The grains or layers may be made from a plurality of different materials that are capable of having the GaN layer crystal-grown thereon and having a different index of refraction than that of GaN, and such grains or layer may be used in combination or stacked. Alternatively, the grains or layers made from at least one material as mentioned above may be used in combination with air pores.

Furthermore, in the third embodiment, the type of the exposing beam of light used in the photolithography is not particularly limited. However, the pattern accuracy can be greatly improved over the prior art by using light with certain wavelengths that can propagate through the GaN substrate 100 without being absorbed, such as g- or i-line.

In the third embodiment, the resist film used in the photolithography step may be either positive or negative type.

While in the third embodiment GaN was used as the material for the nitride semiconductor substrate, this is merely exemplary and other group III nitride semiconductors such as GaN, InN, AlN or their mixed crystals may be employed. In this case, the substrate may include other materials as long as any of those group III nitride semiconductors constitutes the main component of the substrate.

Embodiment 4

A semiconductor substrate according to a fourth embodiment of the present invention, a method of manufacturing the semiconductor substrate, and a pattern forming method for the manufacture of a semiconductor device using the semiconductor substrate will be described by referring to the drawings.

Figure 11:
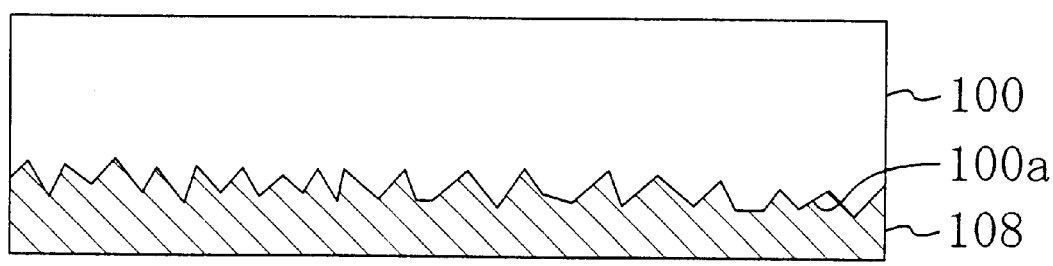
FIG. 11 is a cross sectional view of a semiconductor substrate according to a fourth embodiment of the invention.

FIG. 11 shows a cross-section of the semiconductor substrate according to the fourth embodiment.

As shown FIG. 11, the semiconductor substrate according to the fourth embodiment of the invention comprises a GaN layer 100 with a thickness of 200 μm on the substrate surface side and an $Al_{0.1}Ga_{0.9}N$ layer 108 with a thickness of 15 μm on the substrate back surface side. The back surface of the GaN layer 100, i.e., the interface between the GaN layer 100 and the $Al_{0.1}Ga_{0.9}N$ layer 108, is coarsely formed with height irregularity 100a. Thus the semiconductor substrate according to the fourth embodiment comprises the semiconductor substrate (GaN substrate 100) with the height irregularity 100a formed on its back surface according to the first embodiment shown in FIG. 1, wherein the $Al_{0.1}Ga_{0.9}N$ layer is formed on the height irregularity 100a. The height irregularity 100a should preferably have a height difference of the order of λ/10 or more, where λ is the wavelength of the exposing beam of light used in the photolithography step for the manufacture of the semiconductor device using the semiconductor substrate according to the present embodiment.

The method of manufacturing the semiconductor substrate according to the fourth embodiment shown in FIG. 11 is as follows. This method is substantially the same as that for the semiconductor substrate according to the first embodiment shown in FIG. 2(A)–(E) up to the step shown in FIG. 2(E).

Specifically, there is first prepared the SOS substrate including the sapphire substrate 101 with the 300 μm thickness and the silicon substrate 102 with a thickness of 80 μm, as shown in FIG. 2(A). Then, the AlN layer 103 is grown on the silicon substrate 102 of the SOS substrate to the 200 nm thickness at temperature 1000° C. by the MOVPE method using trimethylaluminum and ammonia as the raw material gases, as shown in FIG. 2(B). This is followed by the growing of the GaN layer 100 with the 250 μm thickness on the AlN layer 103 by the HVPE method using gallium chloride and ammonia as the raw material gases, as shown in FIG. 2(C). Thereafter the silicon substrate 102 is removed by a treatment using the liquid mixture of hydrofluoric acid and nitric acid, whereby the sapphire substrate 101 is separated from the GaN layer 100 forming the nitride semiconductor substrate, i.e., the GaN substrate 100, as shown in FIG. 2(D). Then, as shown in FIG. 2(E), the back surface of the GaN substrate 100 is polished by an abrasive with a grain diameter of 10–50 μm, for example, down to a final thickness of the order of 200 μm, thereby removing the AlN layer 103 and forming the height irregularity 100a on the back surface of the GaN substrate 100. Thus the back surface of the GaN substrate 100 is made coarse and there is obtained the GaN substrate 100 shown in FIG. 1.

Next, the $Al_{0.1}Ga_{0.9}N$ layer 108 is grown on the back surface of the GaN substrate 100 where the height irregularity 100a is formed, to a thickness of 15 μm at temperature 1000° C., by the MOVPE method using trimethylaluminum, trimethylgallium and ammonia as the raw material gases. As a result, the semiconductor substrate according to the fourth embodiment shown in FIG. 11 is obtained. The height irregularity 100a on the back surface of the GaN substrate 100 is filled by the $Al_{0.1}Ga_{0.9}N$ layer 108, thereby flattening the back surface (which may hereunder be referred to simply as the substrate back surface) of the GaN substrate 100 including the $Al_{0.1}Ga_{0.9}N$ layer 108.

The substrate back surface does not necessarily require the flattening. However, in the fourth embodiment, the $Al_{0.1}Ga_{0.9}N$ layer 108 is crystal-grown under the condition of flattening the substrate back surface in order to determine the light scattering effect of the height irregularity 100a (see the first embodiment) in a state where the substrate back surface does not produce any scattering of light. The conditions for crystal-growing the $Al_{0.1}Ga_{0.9}N$ layer 108 such that the flattening of the substrate back surface is achieved differ depending on the crystal-growth method used. However, when the MOVPE method is used, as in the present embodiment, the migration of the group III material (Ga or Al) can be activated by setting the crystal-growth temperature at 900° C. or more and setting the group V/group III raw-material supply ratio (ratio of the supply flow rate of ammonia per minute to the supply flow rate of trimethylaluminum or trimethylgallium per minute) at 1000 or more. Thus, the height irregularity 100a can be filled by the $Al_{0.1}Ga_{0.9}N$ layer 108 to flatten the substrate back surface.

The present inventors formed a line-and-space resist pattern similar to the one used in the first embodiment on the semiconductor substrate according to the fourth embodiment via a processed film by exposure using g-line. When the processed film was etched using the resist pattern as a mask, it was found that the size of the patterned processed film substantially fell within a predetermined range by setting the transmission of the height irregularity 100a, i.e., the light scattering portion, with respect to the exposing beam of light at 80% or less. This is because the light incident on the substrate surface and then reflected by the substrate back surface back to the substrate surface passes through the light scattering portion twice. Namely, even when the transmission of the light scattering portion is 80% and the back surface reflectance of the substrate back which is specular is of the order of 20%, the net back surface reflectance is 20%×80%×80%≈13%, making it possible to achieve a satisfactory pattern formation.

Thus, in accordance with the fourth embodiment, the height irregularity 100a formed at the interface between the GaN layer 100 and the $Al_{0.1}Ga_{0.9}N$ layer 108 functions as the light scattering portion, thereby reducing the intensity of the reflected beam of light caused by the incident beam of light incident on the substrate surface and reflected by the substrate back surface. Accordingly, the problem of exposing the regions of the resist film other than the predetermined exposure regions by the exposing beam of light incident on the substrate surface and reflected by the substrate back surface can be avoided. As a result, the pattern accuracy in the photolithography step can be improved and therefore the manufacturing yield of the nitride semiconductor device can be improved.

In accordance with the fourth embodiment, the back surface of the GaN substrate 100 made coarse by the height irregularity 100a can be flattened by the $Al_{0.1}Ga_{0.9}N$ layer 108, thereby simplifying the manufacturing process of the semiconductor device.

Furthermore, in accordance with the fourth embodiment, the $Al_{0.1}Ga_{0.9}N$ layer 108 as the group III nitride semiconductor layer is crystal-grown on the back surface of the GaN substrate 100. Accordingly, a satisfactory crystallinity can be obtained in the $Al_{0.1}Ga_{0.9}N$ layer 108 formed on the convex portion of the height irregularity 100a, so that a satisfactory crystallinity can be obtained in the nitride semiconductor substrate having the light scattering portion.

While in the fourth embodiment the $Al_{0.1}Ga_{0.9}N$ layer 108 was formed on the back surface of the GaN substrate 100 with the height irregularity 100a, the light scattering effect of the height irregularity 100a can be also realized by forming a layer of other material (the layer may be other than a nitride semiconductor layer) with a different index of refraction than that of the GaN substrate 100. In this case, by providing a material layer on the back surface of the GaN substrate 100 with the height irregularity 100a that functions as an anti-reflection film (see the second embodiment or its variation), the intensity of the reflected beam of light can be further reduced. In the fourth embodiment, the thickness of the $Al_{0.1}Ga_{0.9}N$ layer 108 is made very thick (15 μm) as compared with that of the wavelength of the exposing beam of light such as g- or i-line, in order to fill the height irregularity 100a. As a result, the $Al_{0.1}Ga_{0.9}N$ layer 108 hardly functions as an anti-reflection film. Accordingly, in the fourth embodiment, the reflected beam of light consists of the light reflected by the interface (with a reflectance of about 21%) between the $Al_{0.1}Ga_{0.9}N$ layer 108 and air, and the light reflected by the interface (whose reflectance varies depending on the shape and density of the height irregularity 100a) between the GaN substrate 100 and the $Al_{0.1}Ga_{0.9}N$ layer 108. Thus, in the fourth embodiment, there is a possibility that the light scattered by the interface between the GaN substrate 100 and the $Al_{0.1}Ga_{0.9}N$ layer 108, i.e., the height irregularity 100a, is reflected by the interface between the $Al_{0.1}Ga_{0.9}N$ layer 108 and air to be eventually returned to the surface of the GaN substrate 100. As mentioned above, when a line-and-space (with a line and space width of 2 μm) resist pattern similar to the one used in the first embodiment is formed by exposure using g-line, a satisfactory pattern formation was achieved. This is presumably because of the fact that about 50% of the photomask was occupied by the opening. In other words, in the fourth embodiment, as the area occupied by the opening in the photomask increases, it becomes increasingly difficult to ignore the effect of the light exposing the resist film from below after being scattered by the height irregularity 100a and then reflected by the interface between the $Al_{0.1}Ga_{0.9}N$ layer 108 and air.

Further, in the fourth embodiment, the type of the exposing beam of light used in the photolithography step is not particularly limited. However, a great improvement in the pattern accuracy can be obtained over the prior art by using light with certain wavelengths that can propagate through the GaN substrate 100 without being absorbed, such as g- or i-line, as the exposing beam of light.

In the fourth embodiment, the resist film used in the photolithography step may be either positive or negative type.

In the fourth embodiment, while GaN was used as the material for the nitride semiconductor substrate, this is merely exemplary and a group III nitride semiconductor of GaN, InN, AlN or their mixed crystals may be used. In this case, the substrate may include other materials as long as those group III nitride semiconductor constitute a main component of the substrate.

Embodiment 5

Hereunder a semiconductor substrate according to a fifth embodiment of the present invention, a method of manufacturing the semiconductor substrate, and a pattern forming method for the manufacture of a semiconductor device using the semiconductor substrate will be described by referring to the drawings.

Figure 12:
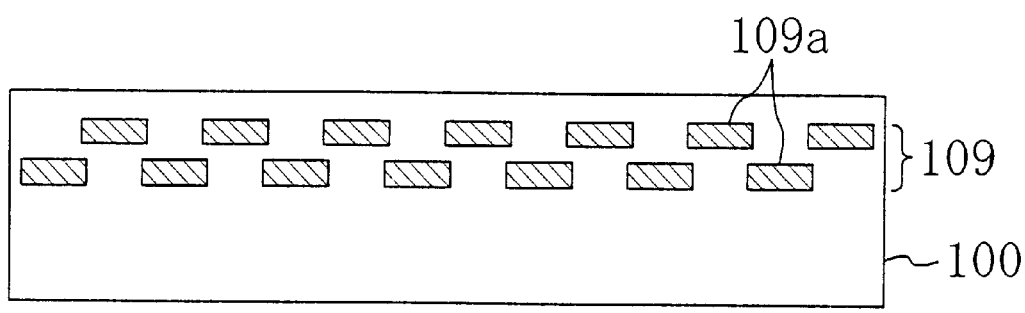
FIG. 12 is a cross sectional view of a semiconductor substrate according to a fourth embodiment of the invention.

FIG. 12 shows a cross sectional view of the semiconductor substrate according to the fifth embodiment.

As shown in FIG. 12, the semiconductor substrate according to the fifth embodiment comprises a group III nitride semiconductor layer, specifically a GaN layer 100. The GaN layer 100 (which may hereunder be referred to as a GaN substrate 100) has a surface which is a (0001) Ga plane and a back surface which is a (0001) N plane. The thickness of the GaN substrate 100 is 300 μm, for example.

The fifth embodiment is characterized in that a plurality of Si layers 109a of a material with a larger absorption coefficient than that of GaN with respect to an exposing beam of light such as g- or i-line, such as Si, for example, are discontinuously embedded inside the GaN substrate 100 at regions with depths of the order of 80 μm and 75 μm. Those plurality of Si layers 109a form a light absorbing portion (for absorbing light incident on the substrate surface) 109. The width of each Si layer 109a (along a direction parallel to the substrate surface) is about 1 μm, and there is about a 1 μm spacing provided between the neighboring Si layers 109a. Thus the Si layers 109a are arranged in a periodic stripe. Each Si layer 109a has a height (in a direction perpendicular to the substrate surface) of about 100 nm. In the GaN substrate 100, the Si layer 109a (a first layer) in the region about 80 μm below the surface and the Si layer 109a (a second layer) in the region 75 μm below the surface are staggered with respect to each other by about 1 μm along a direction parallel to the substrate surface.

FIGS. 13(A)–(E) and FIGS. 14(A)–(C) show cross sectional views illustrating the method of manufacturing the semiconductor substrate according to the fifth embodiment of the invention. This method is substantially identical to the one for the semiconductor substrate according to the first embodiment shown in FIGS. 2(A)–(E) up to the step shown in FIG. 2(D).

Specifically, there is first prepared the SOS substrate as shown in FIG. 2(A), including the sapphire substrate 101 and the silicon substrate 102. Then, as shown in FIG. 2(B), the AlN layer 103 is grown on the silicon substrate 102 of the SOS substrate to the thickness of 200 nm by the MOVPE method using the trimethylaluminum and ammonia as the raw material gases. Thereafter the GaN layer 100 is grown on the AlN layer 103 to a thickness of 220 μm by the HVPE method using the gallium chloride and ammonia as the raw material gases, as shown in FIG. 2(C). In this case, the surface of the GaN layer 100 is a (0001) Ga plane. This is followed by the removal of only the silicon substrate 102, as shown in FIG. 2(D), whereby the sapphire substrate 101 is separated from the GaN layer 100 forming the nitride semiconductor substrate, i.e. the GaN substrate 100.

Figure 13A:
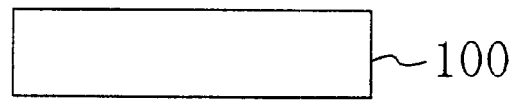
FIGS. 13(A)–(E) a re cross sectional view s of a semiconductor substrate according to a fifth embodiment of the invention in its respective manufacturing steps.

Next, as shown in FIG. 13(A), the AlN layer 103 is removed by polishing while the back surface of the GaN substrate 100 is made specular by polishing by an abrasive with an extremely fine grain diameter.

Figure 13B:
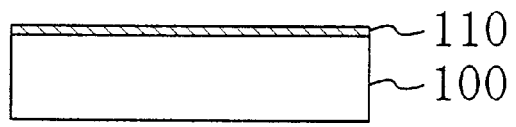
Figure 13C:
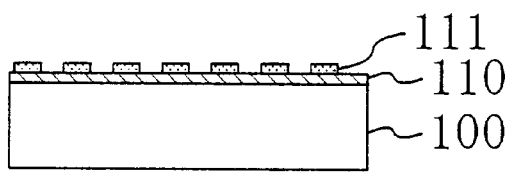

Thereafter a first Si layer 110 is deposited on the GaN substrate 100 to a thickness of 100 nm by an RF sputtering as shown in FIG. 13(B). Then, a first resist pattern 111 is formed on the first Si layer 110 by photolithography, the resist pattern having cyclically arranged openings, as shown in FIG. 13(C)

Figure 13D:
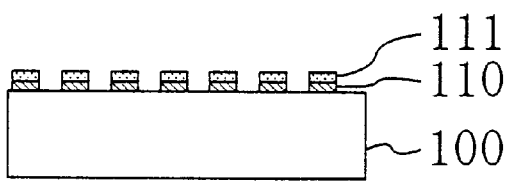
Figure 13E:

The first Si layer 110 is then wet-etched by using hydrogen fluoride using the first resist pattern 111 as a mask, thereby patterning the first Si layer 110 in a cyclic stripe shape, as shown in FIG. 13(D). The first resist pattern 111 is thereafter removed by means of an organic solvent as shown in FIG. 13(E).

Figure 14A:
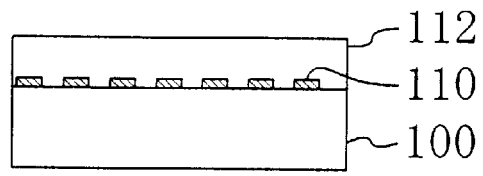
FIG. 14(A)–(C) are cross sectional views of a semiconductor substrate according to a fifth embodiment of the invention in its respective manufacturing steps.

The GaN substrate 100 is then introduced into a GaN crystal growing apparatus such as an MOVPE apparatus, where a first GaN layer 112 is grown on the GaN substrate 100 such that the first Si layer 110 is buried, as shown in FIG. 14(A). Specifically, in the MOVPE apparatus, the first GaN layer 112 is grown at a temperature of 1000° C. using trimethylgallium and ammonia as raw material gases together with hydrogen as a carrier gas. The growth conditions for the first GaN layer 112 differ depending on the crystal-growth method used. In the case of the present embodiment, where the MOVPE method is used, the crystal-growth temperature is set at 900° C. or more and the group V/group III raw-material supply ratio (ratio of the supply flow rate of ammonia per minute to the supply flow rate of trimethylgallium per minute) at 1000 or more. This way, the migration of the group III material (Ga) can be activated, making it possible to grow the first GaN layer 112 in such a manner as to bury the first Si layer 110.

Figure 14B:
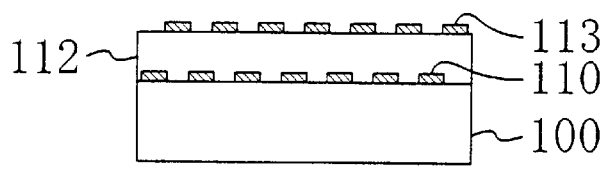

Next, as shown in FIG. 14(B), a second Si layer 113 is deposited on the first GaN layer 112 to a thickness of 100 nm by an RF sputtering. This is followed by the formation of a second resist pattern (not shown) on the second Si layer 113 in the same manner as in the step of FIG. 13(C). Thereafter the second Si layer 113 is etched using the second resist pattern as a mask in the same manner as in the step of FIG. 13(D), whereby the second Si layer 113 is patterned in a cyclic stripe shape, as shown in FIG. 14(B). The second resist pattern is then removed. It should be noted that the first Si layer 110 and the second Si layer 113 are staggered with each other with a predetermined distance when patterned.

Figure 14C:
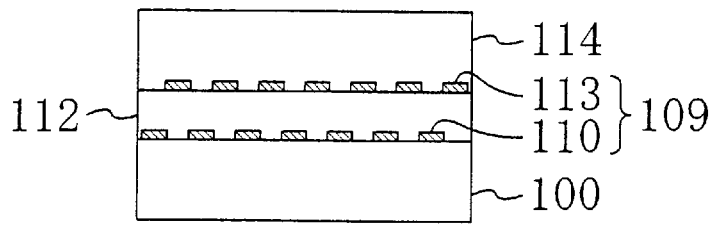

The GaN substrate 100 is then re-introduced into the GaN crystal-growth apparatus such as the MOVPE apparatus, where a second GaN layer 114 is grown on the first GaN layer 112 such that the second Si layer 113 is buried, as shown in FIG. 14(C). In this case, the growth conditions for the second GaN layer 114 are the same as those for the first GaN layer 112. The first GaN layer 112 and the second GaN layer 114 are eventually integrated with the GaN substrate 100 formed from the same material. Thus, there is formed inside the GaN substrate 100 including the first GaN layer 112 and the second GaN layer 114 a light absorbing portion 109 including the patterned first Si layer 110 and second Si layer 113 (i.e., a plurality of Si layers 109a shown in FIG. 12).

The present inventors formed a line-and-space resist pattern similar to the one used in the first embodiment on the semiconductor substrate via a processed film by exposure using g-line. When the processed film was etched using the resist pattern as a mask, it was found that the size of the patterned processed film can be maintained substantially completely within a predetermined range by setting the transmittance of the light absorbing portion 109 below 80%. This is because of the fact that the light incident on the substrate surface and then reflected by the substrate back surface back to the substrate surface passes through the light absorbing portion 109 twice. Namely, even when the transmittance of the light absorbing portion 109 is 80% and the back surface reflectance of the specular substrate back surface is about 20%, the net back surface reflectance is 20%×80%×80%≈13%, which makes it possible to achieve a satisfactory pattern formation.

Thus, in accordance with the fifth embodiment, since the light absorbing portion 109 is formed inside the GaN substrate 100, the light incident on the substrate surface and then reflected by the substrate back surface can be reduced. This prevents the problem of exposing the regions of the resist film other than the predetermined exposure regions by the exposing beam of light incident on the substrate surface and then reflected by the substrate back surface, in the photolithography step for the manufacture o the semiconductor device using the GaN substrate 100. Thus the pattern accuracy in the photolithography step can be increased and therefore the manufacturing yield of the nitride semiconductor device can be increased.

In accordance with the fifth embodiment, the GaN layers (the first GaN layer 112 and the second GaN layer 114) are newly crystal-grown on the GaN substrate 100 including the Si layer 109a in such a manner as to be part of the substrate only after the partial formation of the Si layers 109a on the GaN substrate 100a, the Si layers 109a and the GaN substrate 100a made from different materials. Thus the Si layers 109a can prevent any defects and the like present in the original GaN substrate 100 from being conveyed to the newly formed GaN layers. Accordingly, a satisfactory crystallinity can be obtained in the newly grown GaN layers and therefore a satisfactory crystallinity can also be obtained in the nitride semiconductor substrate having the light absorbing portion.

Further, in accordance with the fifth embodiment, since the Si layers 109a forming the light absorbing portion 109 are distributed non-uniformly along a direction parallel to the substrate surface, not only does the light absorbing portion 109 absorb light but also scatter light, so that the intensity of the reflected beam of light can be further reduced.

In the fifth embodiment, since the Si layers 109a forming the light absorbing portion 109 are electrically conductive, the provision of the light absorbing portion does not cause any reduction in the resistivity of the nitride semiconductor substrate.

While in the fifth embodiment Si was used as the material for the light absorbing portion, this is only exemplary and other materials may be used as long as they are capable of having a GaN layer crystal-grown thereon and have a larger light absorption coefficient than GaN. It should be noted, however, that the material for the light absorbing portion should preferably be electrically conductive. Such material includes W (tungsten) as well as Si. Though tungsten is a metal, tungsten deposited by CVD and the like has little luster and yet has a light absorbing property, making it an ideal material for the light absorbing portion. The light absorbing portion does not necessarily comprise grains or layers of single material; grains or layers of different materials that are capable of having a GaN layer crystal-grown thereon and have larger light absorption coefficients than GaN may be used in combination or laminated. Alternatively, grains or layers of at least one material as mentioned above may be used in combination with air pores.

The absorption coefficient of the material Si of the light absorbing portion in the present embodiment greatly varies depending on the method of depositing the Si layer, the film substance or the contained impurities and the like. The absorption coefficient reaches as much as about $10^5$/cm or more if the thickness of the Si layer is in the range of 300–500 nm. If the thickness of the Si layer is at least 100 nm, the intensity of light passing though the Si layer is reduced to at least 1/e (e: base of natural logarithm), so that the transmission of the Si layer can be made 80% or less regardless of the deposition method, and the Si layer thus functions satisfactorily as the light absorbing portion. On the other hand if the thickness of the Si layer is less than 100 n, particularly less than 50 nm, the transmission of the Si layer may become 80% or more depending on the film substance, in which case the Si layer may not function satisfactorily as the light absorbing portion.

While in the fifth embodiment, the type of the exposing beam of light used in the photolithography step is not particularly limited, the pattern accuracy can be significantly improved over the prior art by using light with certain wavelengths that can propagate through the GaN substrate 100 without being absorbed, such as g- or i-line, as the exposing beam of light.

In the fifth embodiment, the resist film used in the photolithography step may be either positive or negative type.

While in the fifth embodiment, GaN was used as the material for the nitride semiconductor substrate, other group III nitride semiconductors such as GaN, InN, AlN or their mixed crystals may be used. In this case, the substrate may include other materials as long as those group III nitride semiconductors constitute a main component of the substrate.

Embodiment 6

Hereunder a semiconductor substrate according to a sixth embodiment of the invention, a method of manufacturing the semiconductor substrate, and a pattern forming method for the manufacture of a semiconductor device using the semiconductor substrate will be described by referring to the drawings.

Figure 15:
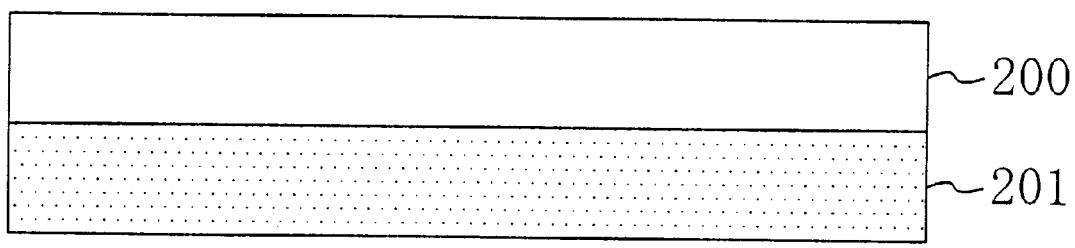
FIG. 15 is a cross sectional view of a semiconductor substrate according to a sixth embodiment of the invention.

FIG. 15 shows a cross sectional view of the semiconductor substrate according to the sixth embodiment.

As shown, the semiconductor substrate according to the sixth embodiment comprises a group III nitride semiconductor layer, specifically a GaN layer 200. The GaN layer 200 (which may hereunder referred to as a GaN substrate 200) has a surface which is a (0001) Ga plane and a back surface which is a (0001) N plane. The thickness of the GaN substrate 200 is 300 μm, for example.

The sixth embodiment is characterized in that impurities such as As (arsenic) that produce a level for absorbing an exposing beam of light such as g- or i-line are introduced into the GaN substrate 200 in a region stretching 150 μm from the back surface, the impurities forming a light absorbing portion 201.

FIGS. 16(A)–(F) are cross sectional views illustrating the respective steps of the method of manufacturing the semiconductor substrate according to the sixth embodiment shown in FIG. 15.

Figure 16A:
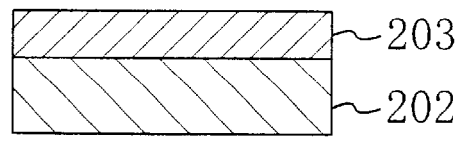
FIGS. 16(A)–(F) are cross sectional views of a semiconductor substrate according to a fifth embodiment of the invention in its respective manufacturing steps.

As shown in FIG. 16(A), there is first prepared an SOS substrate including a sapphire substrate 202 with a thickness of 300 μm and a silicon substrate 203 with a thickness of 80 μm.

Figure 16B:
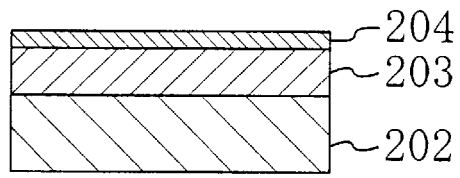

Next, an AlN layer 204 is grown on the silicon substrate 203 of the SOS substrate at a temperature of 1000° C. to a thickness of a 200 nm by an MOVPE method using trimethylgallium and ammonia as raw material gases, as shown in FIG. 16(B).

Figure 16C:
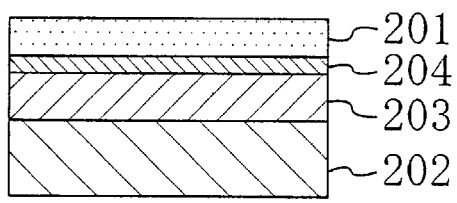

Thereafter a GaN layer 201 is grown on the AlN layer 204 at a temperature of 1000° C. to a thickness of a 150 μm by an HVPE method using gallium chloride obtained by reacting HCl gas with Ga at a temperature of 800° C. and ammonia as raw material gases, as shown in FIG. 16(C). By introducing a gas having As such as arsine as a constituent element into the crystal-growth apparatus at a supply flow rate of e.g. $_{0.1}$% of the ammonia supply flow rate, the light absorbing portion 201 can be formed in the GaN layer 201 where As has been introduced. Instead of introducing the gas such as arsine, As can also be introduced into the GaN layer by placing a GaAs crystal near the region where the HCl gas and Ga are reacted in the crystal-growth apparatus, whereby the light absorbing portion 201 can be formed.

Figure 16D:
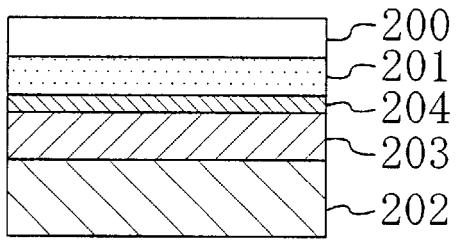

Then, only the supply of arsine is stopped while allowing the crystal growth by the HVPE method, so that a GaN layer 200 is grown on the light absorbing portion 201 to a thickness of 150 μm at a temperature of 1000° C., as shown in FIG. 16(D).

Figure 16E:
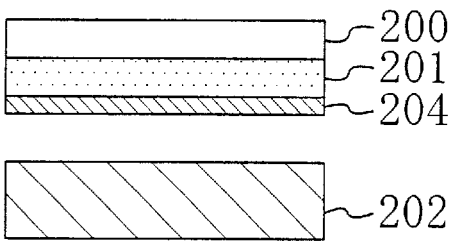

This is followed by a treatment using a liquid mixture of hydrogen fluoride to remove only the silicon substrate 203, as shown in FIG. 16(E), whereby the sapphire substrate 202 is separated from the GaN substrate 200 including the light absorbing portion 201 forming the nitride semiconductor substrate. On the back surface of the GaN substrate 200 is formed the AlN layer 204.

Figure 16F:
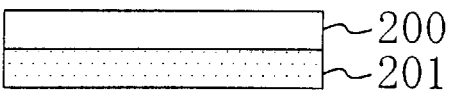

The AlN layer 204 is then removed by polishing using an abrasive with extremely fine grain diameter while making the back surface of the GaN substrate 200 specular, as shown in FIG. 16(F).

The present inventors formed a line-and-space resist pattern similar to the one used in the first embodiment on the semiconductor substrate according to the sixth embodiment via a processed film by exposure using g-line. When the processed film was etched using the resist pattern as a mask, it was found that the size of the patterned processed film can be made to fall almost completely within a predetermined range by setting the transmission of the light absorbing portion 201 at 80% or less. This is because the light incident on the substrate surface passes through the light absorbing portion 201 twice before it is reflected by the substrate back surface and return to the substrate surface. Namely, even though the transmittance of the light absorbing portion 201 is 80% and the back surface reflectance on the specular plane of the substrate back surface is about 20%, the net back-surface reflectance is 20%×80%×80% 13%, thus allowing the satisfactory pattern formation to occur.

Thus, in accordance with the sixth embodiment, since the light absorbing portion 201 is formed in a region on the back surface side of the GaN substrate 200, the intensity of light incident on the substrate surface and then reflected by the substrate back surface can be reduced. This prevents the problem of exposing the regions of the resist film other than predetermined exposure regions by the exposing beam of light incident on the substrate surface and then reflected by the substrate back surface in the photolithography step for the manufacture of the semiconductor device using the GaN substrate 200. Accordingly, the pattern accuracy in the photolithography step can be improved and therefore the manufacturing yield of the nitride semiconductor device can be increased.

Furthermore, in accordance with the sixth embodiment, the light absorbing portion 201 is formed by implanting impurities into the GaN layer forming the GaN substrate 200, a lowering of the crystallinity of the nitride semiconductor substrate with the light absorbing portion can be prevented.

Hereunder, necessary conditions for lowering the transmission of the light absorbing portion 201 to 80% or below will be explained.

Generally, introduction of impurities of certain kind into a semiconductor produces a light absorbing property. Now, let z be a direction perpendicular to a main plane of the semiconductor substrate, α(z) the light absorption coefficient at position z in the semiconductor substrate, and I(z) the light intensity at position z. Based on a relationship between the amount of attenuation of light with light intensity I(z) and the light absorption coefficient, the following equation (1) is satisfied.

$$\frac{dI(z)}{dz} = -\alpha(z) \times I(z) \quad \text{(equation 1)}$$

Assume now that the region in which the impurities are introduced in the semiconductor substrate, i.e. the light absorbing portion, is distributed from position z1 to position z2. Let z0 be the thickness of the light absorbing portion (z2-z1), I0 the light intensity at the point of incidence on the light absorbing portion, and I the light intensity at the point of exit from the light absorbing portion, and the following equation (2) is satisfied.

$$\log\left(\frac{I}{I_0}\right) = \int_{z1}^{z2} -\alpha(z)\,dz \quad \text{(equation 2)}$$

$$= z0 \int_{z1}^{z2} \frac{-\alpha(z)}{z0}\,dz$$

Since the equation $$\int_{z1}^{z2} \frac{\alpha(z)}{z0}\,dz \quad \text{(equation 3)}$$

gives an average of the light absorption coefficient α(z) from position z1 to z2, substituting a for this equation, the following equation (4) is satisfied.

$$\frac{I}{Io} = \exp(-\alpha \times z0) \qquad \text{(equation 4)}$$

Here, based on the condition that the transmittance I/I0 is 80% or less, finding the range of the thickness z0 of the light absorbing portion using equation (4) gives $$z0 \geq \frac{0.223}{\alpha} \qquad \text{(equation 5)}$$

Thus, $0.223/\alpha$ is the minimum thickness of the light absorbing portion 201 necessary for making the transmittance of the light absorbing portion 201 80% or less.

On the other hand, with regard to the impurity density in the light absorbing portion 201, while that a higher impurity density is preferable because that will result in a higher $\alpha$ and therefore permit a reduction in the thickness of the light absorbing portion 201, i.e., the impurity layer, too high an impurity density will cause a displacement in the lattice constant of the crystals in the substrate, resulting in a deteriorated crystallinity of the substrate. Accordingly, in the case of As as the impurity for forming the light absorbing portion 201, its impurity density should preferably lie within a range from the order of $1 \times 10^{13}$ cm$^{-3}$ to $1 \times 10^{20}$ cm$^{-3}$.

While in the sixth embodiment, As was used as the impurity for forming the light absorbing portion 201, any other impurity may be used as long as it produces a level that absorbs the exposing beam of light when introduced into the GaN layer. For example, C (carbon), O (oxygen), Si, S (sulfur), Cl (chlorine) or P (phosphorus) may be used instead of As. Even when using C, O, Si, S, Cl or P as the impurity for forming the light absorbing portion 201, too, the impurity density should preferably lie within the range from the order of $1 \times 10^{13}$ cm$^{-3}$ to $1 \times 10^{20}$ cm$^{-3}$. When introducing C in the GaN layer, a C-containing gas such as $CH_4$ may be used during the crystal growth of the GaN layer. When introducing O into the GaN layer, an O-containing gas such as $NO_2$ may be used during the crystal growth of the GaN layer. When Si is introduced into the GaN layer, a Si-containing gas such as $SiH_4$ may be used during the crystal growth of the GaN layer. When S is introduced into the GaN layer, a S-containing gas such as SF6 may be used during the crystal growth of the GaN layer. When Cl is introduced in to the GaN layer, e.g. the group V/group III raw-material supply ratio (ratio of the supply flow rate of ammonia per minute to the supply flow rate of gallium chloride per minute) may be set at 100 or less, thereby facilitating the entry of Cl into the nitride site of GaN. When P is introduced into the GaN layer, e.g. phosphine may be mixed with ammonia during the crystal growth of the GaN layer. Further, by introducing C, O, Si, S, Cl, P or As as mentioned above to the GaN layer as impurities while properly selecting the used gas, the occurrence of contamination and the like in the crystal growth apparatus can be prevented.

While in the sixth embodiment the light absorbing portion 201 was provided in a region on the back surface side of the GaN substrate 200, the entire substrate may constitute the light absorbing portion by introducing the impurity into the entire substrate, as long as the thickness z0 of the light absorbing portion satisfies equation (5).

While in the sixth embodiment the light absorbing portion 201 was uniformly provided in a region on the back surface side of the GaN substrate 200, the light absorbing portion may instead be distributed non-uniformly along a direction parallel to the substrate surface. In this way, not only does the light absorbing portion absorbs light but also it can scatter light, thereby further reducing the intensity of the reflected beam of light. In this case, by introducing the impurity only to an area below the predetermined exposure region of the resist film in the GaN substrate 200, the following advantages can be obtained. For example, when a device is formed by covering an area near the active layer on the substrate by a resist pattern, as when a ridge-type laser device is to be produced, by not introducing the impurity into an area below the active layer of the substrate so that there is less impurity being diffused near the active layer from the substrate, an increase of the operating current and the like due to light absorption by the impurity can be prevented. With regard to the semiconductor layers other than the active layer on the substrate, as the pattern accuracy in the photolithography step increases, the pattering yield can be increased. For doping the impurity into the GaN substrate such that the light absorbing portion is distributed non-uniformly, there are various methods including the one using an ion beam to ion-inject the impurity into the GaN substrate, or the one based on a combination of a selective growth and an embedded growth for growing the nitride semiconductor layer for the formation of the substrate. In the latter method, regions where the impurity is not to be doped are covered by a mask and the nitride semiconductor layer is selectively grown by doping the impurity, and then the nitride semiconductor layer is embedded-grown without doping the impurity.

Further, while in the sixth embodiment the GaN layer was provided with the light absorbing property by the introduction of the impurity into the GaN layer, the giving of the light absorbing property to the GaN layer may be effected by forming a point defect in the GaN layer. In this case, the point defect can be formed in the GaN layer by implanting e.g. proton into the GaN layer.

The type of the exposing beam of light used in the photolithography step in the sixth embodiment is not particularly limited. However, by using light with certain wavelength that can propagate through the GaN substrate 200 without being absorbed, such as g- or i-line, as the exposing beam of light, the pattern accuracy can be greatly improved over the prior art.

The resist film used in the photolithography step in the sixth embodiment may be either positive or negative type.

While in the sixth embodiment GaN was used as the material for the nitride semiconductor substrate, this is merely exemplary and other group III nitride semiconductors such as GaN, InN, AlN or their mixed crystals may be used. In this case, the substrate may include other materials as long as those group III nitride semiconductors constitute a main component of the substrate.

Embodiment 7

Hereunder a semiconductor substrate according to a seventh embodiment of the present invention, a method of manufacturing the semiconductor substrate, a semiconductor device using the semiconductor substrate and a method of manufacturing the semiconductor device will be described by referring to the drawings.

Figure 17:
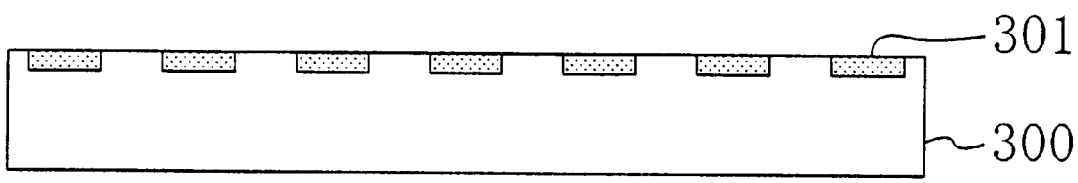
FIG. 17 is a cross sectional view of a semiconductor substrate according to a seventh embodiment of the invention.

FIG. 17 is a cross sectional view of the semiconductor substrate according to the seventh embodiment.

As shown in FIG. 17, the semiconductor substrate according to the seventh embodiment comprises a group III nitride semiconductor layer, specifically a GaN layer 300. The thickness of the GaN layer 300 (which may hereunder be referred to as a GaN substrate 300) is e.g. 250 μm, and either side of the GaN layer is made specular.

The seventh embodiment is characterized in that a plurality of light absorbing portions (for absorbing light incident on the substrate surface) 301 are formed in a stripe shape by introducing an impurity such as As that produces a level absorbing an exposing beam of light such as g- or i-line into a surface portion of the GaN substrate 300. Each light absorbing portion 301 has a width (along a direction parallel to the substrate surface) of the order of 310 µm. The light absorbing portions 301 are distanced from each other by about 10 µm.

FIGS. 18(A)–(E) shows cross sectional views illustrating the respective steps of the method of manufacturing the semiconductor substrate according to the seventh embodiment of FIG. 17.

Figure 18A:
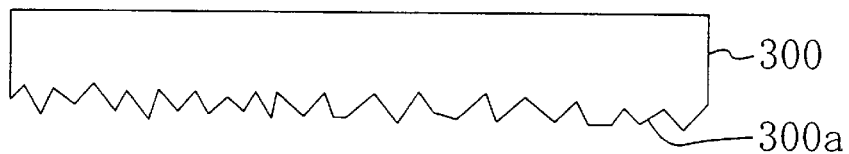
FIGS. 18(A)–(E) are cross sectional views of a semiconductor substrate according to a seventh embodiment of the invention in its respective manufacturing steps.

First, as shown in FIG. 18(A), there is prepared a GaN substrate 300 with a thickness of 300 µm having height irregularity 300a formed on its back surface, the height irregularity 300a having a height difference of the order of ¹⁄₁₀ the wavelength of the exposing beam of light. The GaN substrate 300 may be produced by the method of manufacturing the semiconductor substrate according to the first embodiment.

Figure 18B:
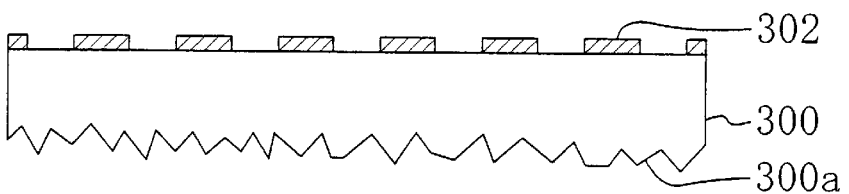

Then, as shown in FIG. 18(B), a plurality of hard masks 302 made of $SiO_2$ are formed by photolithography on the surface of the GaN substrate 300. Here, the width of each hard mask 302 is 300 µm, and the distance between the neighboring hard masks 302 is 20 µm. In the photolithography step for the formation of the hard masks 302, the height irregularity 300a on the back surface of the GaN substrate 300 functions as the light scattering portion (see the first embodiment), so that the pattern accuracy of the hard masks 302 can be improved.

Figure 18C:
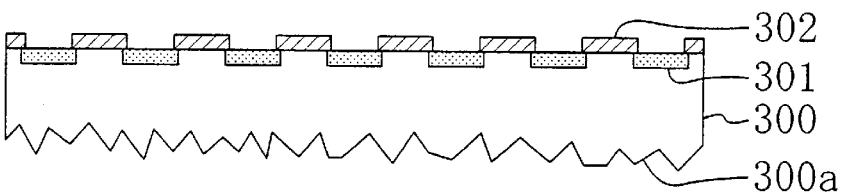

Thereafter As is introduced into the surface portion of the GaN substrate 300 by means of the hard masks 302, as shown in FIG. 18(C), whereby a plurality of light absorbing portions 301 are formed in a stripe shape.

Figure 19:
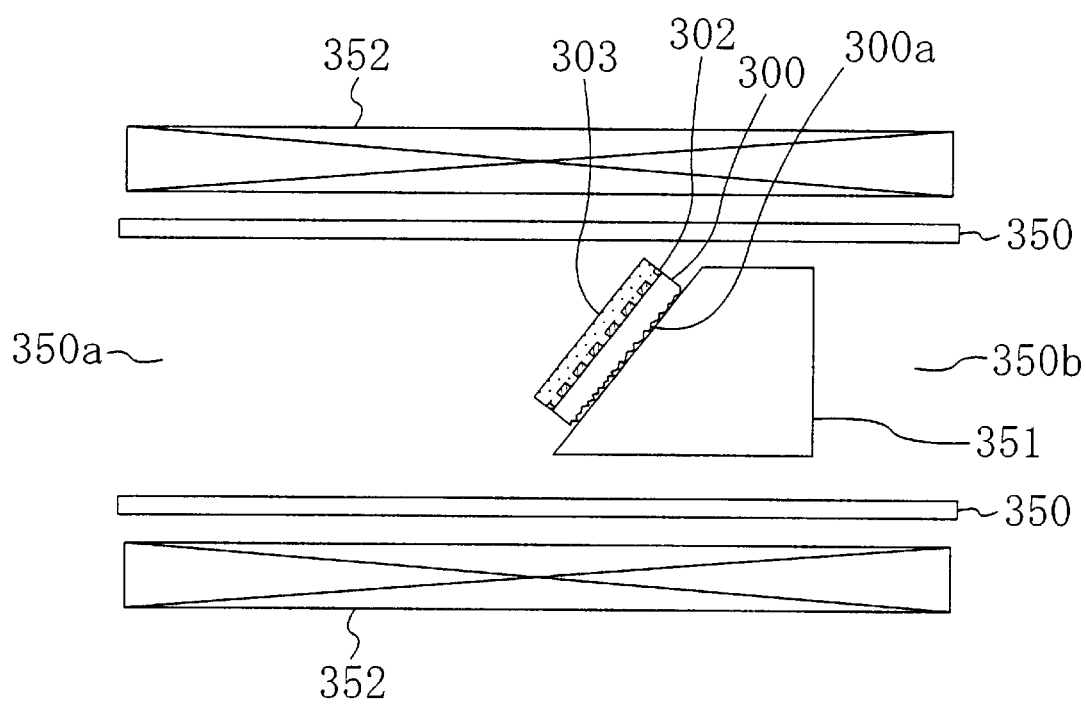
FIG. 19 illustrates an example of the method of implanting As into the GaN substrate in the method of manufacturing the semiconductor substrate according to the seventh embodiment of the invention.

While the method of implanting As into the GaN substrate 300 is not particularly limited, an example of the As implantation method in the method of manufacturing the semiconductor substrate according to the seventh embodiment will hereinafter be described by referring to FIG. 19. As shown in FIG. 19, after forming a GaAs layer 303 on the surface of the GaN substrate 300 provided with the hard masks 302, the GaN substrate 300 is placed on a susceptor 351 within a reaction pipe 350 made from quartz and the like. Then, ammonia is supplied from a gas inlet 350a of the reaction pipe 350, while ammonia near the susceptor 351 is heated to a temperature of about 1000° C. by a heating means 352 provided externally to the reaction pipe 350. As the As in the GaAs layer 303 diffuses into the surface portion of the GaN substrate 300, the light absorbing portion 301 is formed. Used ammonia is discharged from a gas outlet 350b of the reaction pipe 350. The susceptor 351 is made from, for example, graphite. The heating means 352 may comprise a tubular resistance-wire heater.

The As implantation in the atmosphere of ammonia as shown in FIG. 19 is carried out so that the escape of nitrogen from the back surface (coarse plane) of the GaN substrate 300 can be prevented by nitrogen produced by the decomposition of ammonia. Therefore, the As implantation may be effected in an atmosphere of another gas containing nitrogen atoms, instead of ammonia.

Since the GaAs layer 303 formed on the GaN substrate 300 does not have to be a single crystal, the GaAs layer 303 may be formed by sputtering. Alternatively, a compound layer containing an As layer or As may be formed, instead of the GaAs layer 303.

The temperature during the diffusion of As in the GaN substrate 300 may be lower than 1000° C. However, in this case, since the diffusion rate of As decreases, it is necessary to diffuse As over a longer period of time in order to obtain a desired distribution profile of the light absorbing portions 301, i.e., a desired As diffusion profile. It is preferable, however, to set the diffusion temperature of As at 700° C. or more when As is to be diffused such that the transmittance of the light absorbing portions 301 is sufficiently lowered within a practical diffusion time of the order of several hours to several tens of hours.

The width of each light absorbing portion 301 obtained by the As implantation step of FIG. 19 becomes 310 µm which is wider than the width of each hard mask 302 due to the diffusion of As. Accordingly, the intervals between the light absorbing portions 301 becomes 10 µm. The thickness of each light absorbing portion 301 is about 5 µm.

Figure 18D:
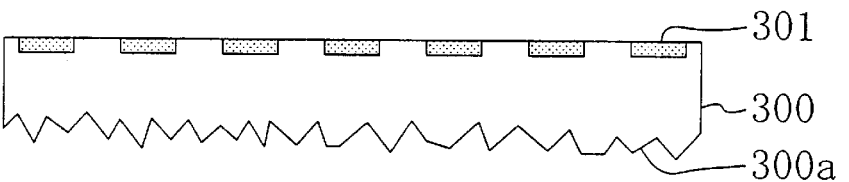
Figure 18E:
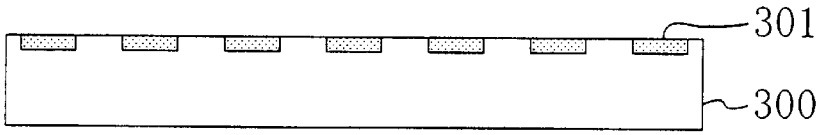

The hard masks 302 are then removed by a wet etching using e.g. hydrogen fluoride as shown in FIG. 18(D), and thereafter the back surface of the GaN substrate 300 having the height irregularity 300a is polished, thereby making the back surface specular, as shown in FIG. 18(E).

The resultant GaN substrate 300 with the light absorbing portions 301 is advantageous in that when making a nitride semiconductor device using the GaN substrate 300, e.g. a high performance ridge-type laser device with a low operating current can be manufactured at high yields.

Hereunder, the method of manufacturing the semiconductor device using the semiconductor substrate according to the seventh embodiment, specifically a ridge-type laser device, will be described by referring to the FIGS. 20(A)–(D) and FIGS. 21(A)–(D).

Figure 20A:
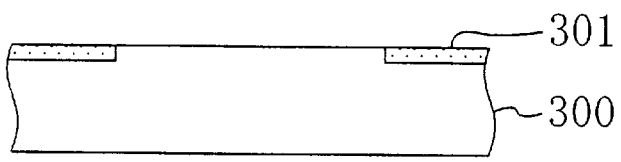
FIGS. 20(A)–(D) are cross sectional views illustrating the respective steps of the method of manufacturing the semiconductor device using the semiconductor substrate according to the seventh embodiment of the invention.

As shown in FIG. 20(A), there is first prepared the GaN substrate 300 having the light absorbing portions 301 (see FIG. 17). In the following description, only a region sandwiched by a pair of light absorbing portions 301 in the GaN substrate 300 (i.e. a ridge-structure formed region) and adjacent areas will be referred.

Figure 20B:
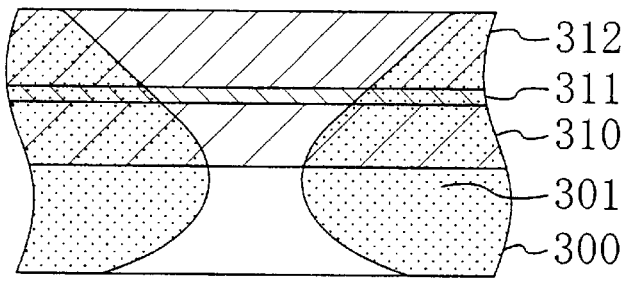

As shown in FIG. 20(B), there are sequentially formed on the GaN substrate 300 an n-type $Al_{0.1}Ga_{0.9}N$ clad layer with a thickness of 1 µm, a quantum-well active layer composed of an $In_{0.2}Ga_{0.8}N$ well layer with a thickness of 30 nm and an $In_{0.02}Ga_{0.98}N$ barrier layer, and a p-type $Al_{0.1}Ga_{0.9}N$ clad layer 312 with a thickness of 2 µm. The formation of those respective nitride semiconductor layer may be effected by an MOVPE method, for example. When the respective nitride semiconductor layers are formed by the MOVPE method at a temperature of the order of 1000° C., for example, the As in the light absorbing portions 301 is further diffused. As a result, as shown in FIG. 20(B), the distributed regions of the light absorbing portions 301 further expand. Thus, in the vicinity of the interface between the GaN substrate 300 and the n-type $Al_{0.1}Ga_{0.9}N$ clad layer 310, for example, the distance between the neighboring light absorbing portions 301 is of the order of 2–3 µm, and that of the neighboring light absorbing portions 301 in the vicinity of the quantum-well active layer 311 is of the order of 5 µm.

Figure 20C:
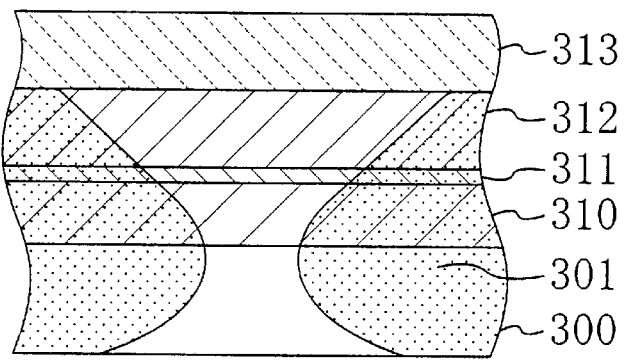
Figure 20D:
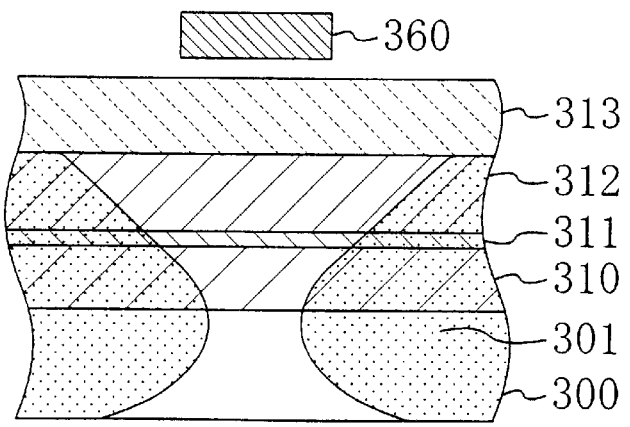

Thereafter, a positive-type resist film 313 is formed on the p-type $Al_{0.1}Ga_{0.9}N$ clad layer 312 as shown in FIG. 20(C). This is followed by an irradiation of the resist film 313 with an exposing beam of light of g-line via a photomask 360 covering the ridge-structure formed region (between the neighboring light absorbing portions 301) with a width of about 3 µm, as shown in FIG. 20(D). Due to the light absorbing portions 301 in the regions not covered by the photomask 360 in the GaN substrate 300 (including the respective nitride semiconductor layers), the intensity of the reflected beam of light from the back surface of the GaN substrate 300 is reduced during exposure. Accordingly, it becomes possible to prevent the problem of exposing the portions below the photomask 360 in the resist film 313 by the exposing beam of light diffracted inside the photomask 360 near the photomask 360 and then reflected by the back surface of the GaN substrate 300.

Figure 21A:
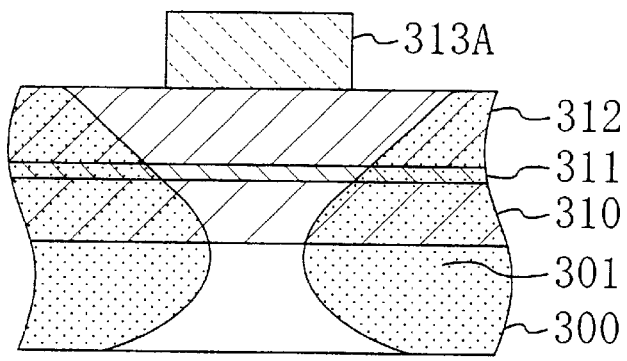
FIGS. 21(A)–(D) are cross sectional views illustrating the respective steps of the method of manufacturing the semiconductor device using the semiconductor substrate according to the seventh embodiment of the invention.

Then, as shown in FIG. 21(A), the resist film 313 is developed and the portions of the resist film 313 that were irradiated by the exposing beam of light are removed, thereby forming a resist pattern 313A. In this case, since the unwanted exposure of the resist film 313 has been prevented as described above, the resist pattern 313A can be accurately formed.

Figure 21B:
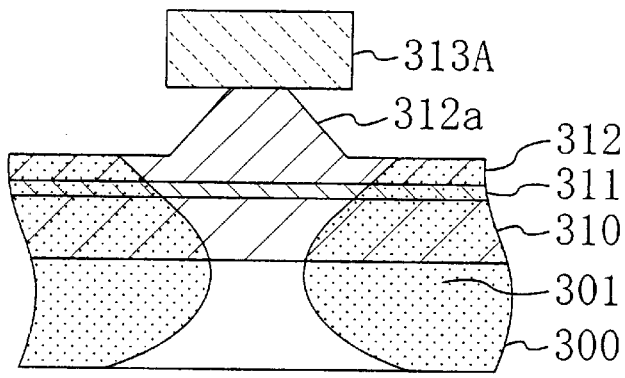

Next, as shown in FIG. 21(B), the p-type $Al_{0.1}Ga_{0.9}N$ clad layer 312 is etched by e.g. a reactive ion etching using a Cl gas plasma while using the resist pattern 313A as a mask, whereby a ridge structure 312a is formed. As the p-type $Al_{0.1}Ga_{0.9}N$ clad layer 312 is side-etched, the ridge structure 312 is trapezoidal in shape.

Figure 21C:
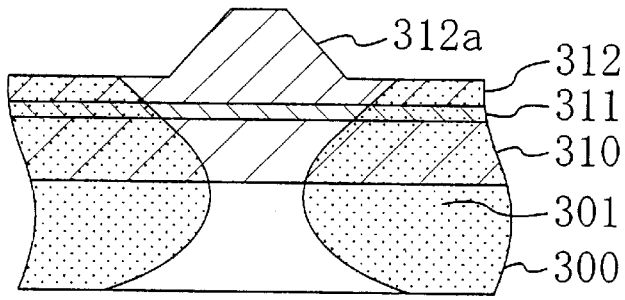
Figure 21D:
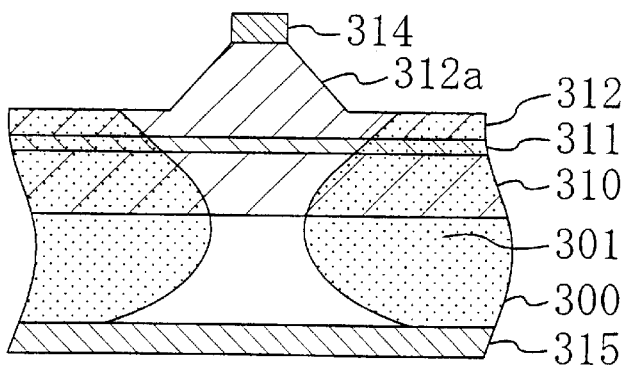

The resist pattern 313A is then removed by an organic solvent and the like as shown in FIG. 21(C). Thereafter a p-electrode 314 with a thickness of about 1 $\mu$m composed of a multiple-layer structure of Ni(nickel) and Au(gold) is formed on the ridge structure 312a, as shown in FIG. 21(D). At the same time, an n-electrode 315 with a thickness of about 1 $\mu$m composed of a multiple-layer structure of Ti(titan) and Al is formed on the back surface of the GaN substrate 300. Since the back surface of the GaN substrate 300 is made specular (see FIG. 18(E)), the n-electrode 315 can be closely formed thereon without causing breaks or the like. While not shown, the GaN substrate on which the nitride semiconductor layer structures have been formed as shown in FIG. 21(D), i.e., a semiconductor wafer, is divided by cleaving, thereby completing the nitride semiconductor laser device.

Figure 22:
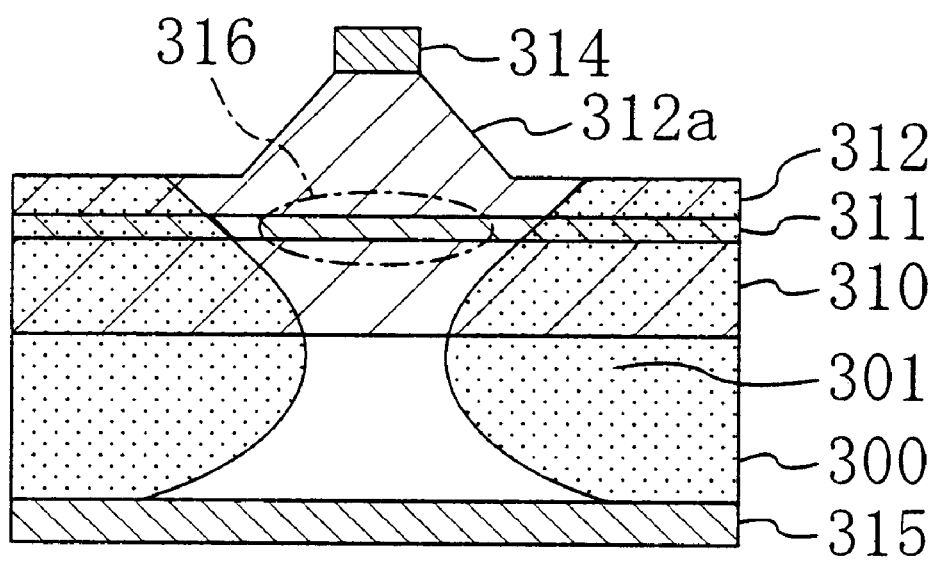
FIG. 22 is a cross sectional view of the semiconductor device using the semiconductor substrate according to the seventh embodiment of the invention.
Figure 23:
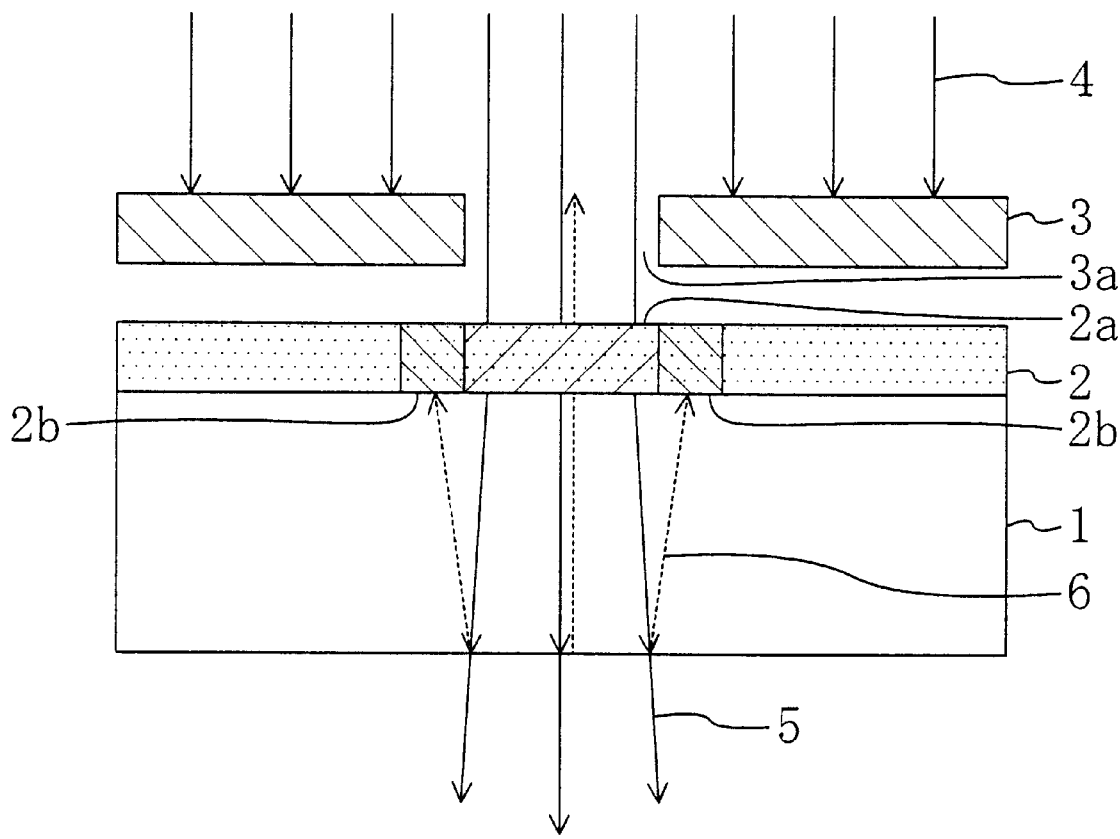
FIG. 23 illustrates the exposure of the resist film formed on the conventional nitride semiconductor substrate.

FIG. 22 shows a cross-section of the nitride semiconductor laser device produced by the above-described method, i.e., the semiconductor device according to the seventh embodiment, along with the distribution of the light-emitting region when the device is emitting light.

As the As impurity absorbs light with wavelengths of more or less 400 nm, if the As impurity exists in the light-emitting region, the light emitted by the nitride semiconductor laser device will be absorbed and the luminous efficiency will drop. This problem, however, can be prevented in the seventh embodiment because, as shown in FIG. 22, the light-emitting region 316 is not located in the light absorbing portions 301 including the As impurity and therefore the emitted laser beam of light is not absorbed.

Thus, in accordance with the seventh embodiment, since the light absorbing portions 301 are formed on the surface portion of the GaN substrate 300, the intensity of light incident on the substrate surface and then reflected by the substrate back surface can be reduced. This makes it possible to prevent the problem of exposing regions of the resist film other than the predetermined regions by the exposing beam of light incident on the substrate surface and reflected by the substrate back surface in the photolithography step for the manufacture of the semiconductor device using the GaN substrate 300. Accordingly, the pattern accuracy in the photolithography step can be improved and therefore the manufacturing yield of the nitride semiconductor device can be improved.

In accordance with the seventh embodiment, since the light absorbing portions 301 are formed by the implantation of an impurity into the GaN layer forming the GaN substrate 300, a drop in the crystallinity of the nitride semiconductor substrate having the light absorbing portions can be prevented.

Further, in accordance with the seventh embodiment, the light absorbing portions 301 are formed by introducing the impurity only into the portions of the GaN substrate 300 below the predetermined exposure region of the resist film. As a result, there is less of the impurity diffused near the active layer above the GaN substrate 300 from the GaN substrate 300. This makes it possible to prevent e.g. an increase in the operating current due to light absorption by the impurity, while the pattern accuracy in the photolithography step is improved and therefore other nitride semiconductor layers other than the active layer can be patterned at high yields.

In accordance with the seventh embodiment, since the back surface of the GaN substrate 300 is made specular, the manufacturing process of the semiconductor device using the GaN substrate 300 can be simplified.

While in the seventh embodiment the light absorbing portions 301 were provided in the GaN substrate 300, a light scattering portion (see e.g. the first embodiment) or an anti-reflection film, i.e., a light transmitting portion (see e.g. the second embodiment), may be provided instead.

While in the seventh embodiment the semiconductor device with a ridge structure was produced using the GaN substrate 300, a semiconductor device with a trench structure may be produced instead.

In the seventh embodiment, the type of the exposing beam of light used in the photolithography step is not particularly limited. However, a great improvement in the pattern accuracy over the prior art can be obtained by using light with certain wavelengths that can propagate through the GaN substrate 300 without being absorbed, such as g- or i-line, as the exposing beam of light.

While in the seventh embodiment, a positive-type resist film was use in the photolithography step shown in FIGS. 20(C) and (D) and FIG. 21(A), a negative-type resist film may be used instead. In this case, the resist pattern is formed by using a photomask that covers regions other than the region (sandwiched by the light absorbing portions 301) where the ridge structure is to be formed, and the resist film is developed so as to remove the portions of the resist film that were not exposed to the exposing beam of light.

Furthermore, while in the seventh embodiment GaN was used as the material for the nitride semiconductor substrate, this is only exemplary and other group III nitride semiconductors such as GaN, InN, AlN or their mixed crystals may be used. In this case, the substrate may include other materials as long as those group III nitride semiconductors constitute a main component of the substrate.

What is claimed is:

1. A method of manufacturing a semiconductor substrate, comprising the steps of:

partially forming a light scattering portion on a first semiconductor layer comprising a group III nitride as a main component, the scattering portion made of a material with an optical index of refraction which is different from that of said group III nitride; and crystal-growing a second semiconductor layer on said first semiconductor layer including said light scattering portion, the second semiconductor layer comprising said group III nitride as a main component, whereby a semiconductor substrate comprising said first semiconductor layer, said light scattering portion and said second semiconductor layer is formed.

2. The method of manufacturing a semiconductor substrate according to claim 1, wherein the step of partially forming said light scattering portion comprises the steps of:

forming a film on the entire surface of said semiconductor layer to serve as said light scattering portion;

forming a mask pattern partially on said film and etching said film by means of said mask pattern such that a portion of said film that is not covered by said mask pattern is removed to form said light scattering portion; and removing said mask pattern.

3. A method of manufacturing a semiconductor substrate comprising the steps of:

forming a height irregularity on a back surface of a semiconductor layer comprising a group III nitride as a main component, the height irregularity having a height difference exceeding a predetermined value; and forming an embedded film on said back surface of said semiconductor layer on which said height irregularity is formed, the embedded film being made of a material with a different optical index of refraction than that of said group III nitride, whereby a semiconductor substrate comprising said semiconductor layer and said embedded film is formed.

4. A pattern forming method comprising the steps of:

forming a semiconductor layer made of a group III nitride on one plane of a semiconductor substrate that is made of said group III nitride as a main component and has a scattering portion, the scattering portion formed on another plane or inside thereof for scattering a beam of light incident on said one plane;

forming a positive- or negative-type resist film on said semiconductor layer;

irradiating said resist film with a beam of exposing light through a photomask with an opening portion;

developing said resist film so that, where said resist film is of the positive type, a portion of the resist film that is irradiated by said beam of exposing light is removed and where said resist film is of the negative type, a portion of said resist film that is not irradiated by said beam of exposing light are removed, whereby a resist pattern is formed; and etching said semiconductor layer while using said resist pattern as a mask.

* * * * *